United States Patent [19]

Allgor et al.

[11] 4,418,388
[45] Nov. 29, 1983

[54] ENGINE WAVEFORM PATTERN ANALYZER

[75] Inventors: Clarence B. Allgor, Portage; Clair J. St. Clair, Otsego; Richard A. Pearson, Kalamazoo, all of Mich.

[73] Assignee: The Allen Group Inc., Melville, N.Y.

[21] Appl. No.: 178,187

[22] Filed: Aug. 14, 1980

[51] Int. Cl.³ .......................................... G01M 15/00
[52] U.S. Cl. ............................... 364/431.01; 364/179; 364/551
[58] Field of Search ............... 364/431, 432, 551, 550, 364/554, 431.01, 540, 179, 431.12, 431.07, 431.04; 73/117.2, 116; 324/379, 380, 384; 328/114; 340/347 AD

[56] References Cited

U.S. PATENT DOCUMENTS

| | | | |
|---|---|---|---|
| 3,144,638 | 8/1964 | Hesler et al. | 365/233 |
| 3,439,534 | 4/1969 | Pilgrim | 73/117 |
| 3,485,093 | 12/1969 | Muller et al. | 73/116 |
| 3,521,245 | 7/1970 | Rogers | 365/78 |
| 3,630,076 | 12/1971 | Staudt | 73/117.3 |
| 3,949,175 | 4/1976 | Tanizoe et al. | 340/173 AD |
| 3,955,135 | 5/1976 | Fastaia | 324/384 |
| 4,027,532 | 6/1977 | Trussell | 364/431 |
| 4,125,894 | 11/1978 | Cashel et al. | 364/442 |
| 4,128,005 | 12/1978 | Arnston et al. | 73/117.3 |
| 4,132,947 | 1/1979 | Weischedel | 328/114 |
| 4,179,922 | 12/1979 | Bouverie et al. | 364/551 |
| 4,215,412 | 7/1980 | Bernier et al. | 364/551 |
| 4,241,403 | 12/1980 | Schultz | 364/551 |
| 4,267,569 | 5/1981 | Baumann | 364/431 |
| 4,270,174 | 5/1981 | Karlin | 364/551 |
| 4,281,388 | 7/1981 | Friend | 364/565 |
| 4,291,382 | 9/1981 | Full | 364/551 |
| 4,291,383 | 9/1981 | Tedeschi | 324/384 |
| 4,308,585 | 12/1981 | Jordan | 364/179 |

OTHER PUBLICATIONS

Sheingold, Daniel H., *Analog-Digital Conversion Handbook*, Norwood, Mass., Analog Devices Inc., Jun. 1972.
Allen Test Programmed Training Course Manuals 16-000 Series, [Part No. 25601] and 25-000 Series [Part No. 25620], Engine Analyzers, [two manuals].
Operation Guide, 25-000 Series Engine Analyzers.
Allen Test Programmed Training Course Manual 23-000 Series, Infrared Analyzer.

*Primary Examiner*—Charles E. Atkinson
*Assistant Examiner*—Michael R. Fleming
*Attorney, Agent, or Firm*—Kenyon & Kenyon

[57] ABSTRACT

An apparatus which permits the automated diagnosis of automobile engine electrical system waveform patterns is disclosed. Employed in conjunction with an addressable random access memory which stores digitized information concerning the waveform are further means which logarithmically reduce input amplitude values of the waveform and coordinates sampling times for the waveform with engine RPM so that the memory capacity is fully utilized. Input conversion of the waveform is accomplished by a tracking analog-to-digital converter using comparator means which also provides a waveform peak detector. Upon an address command, the memory output is input into a read only memory which provides an anti-log conversion of the logarithmic value stored in the memory, thereby providing an output corresponding to an actual value signal.

42 Claims, 10 Drawing Figures

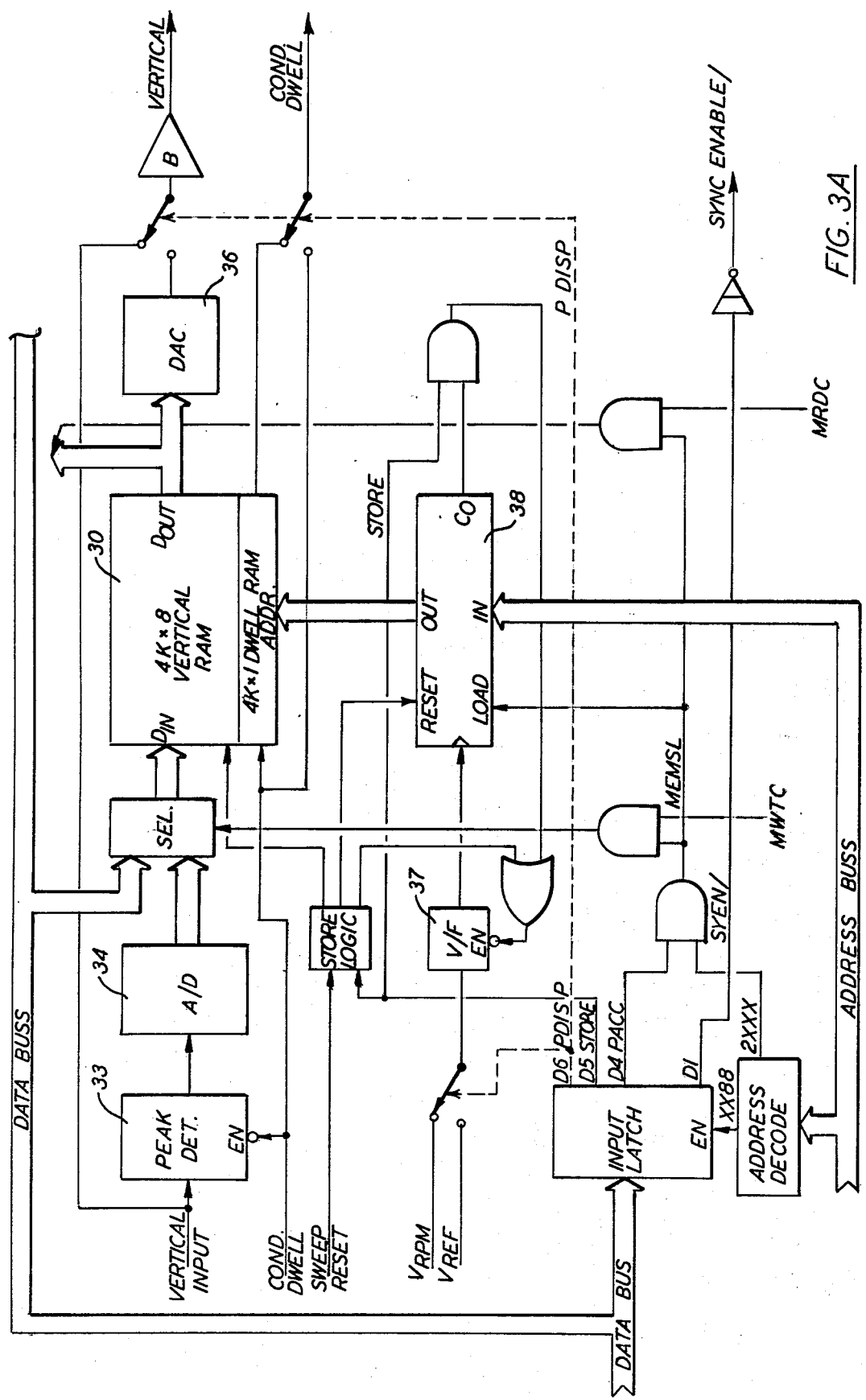

ENGINE WAVEFORM PATTERN ANALYZER

FIELD OF THE APPLICATION

This invention relates to improved programmable apparatus for the analysis and diagnosis of operating conditions of a multi-cylinder thermal combustion engine and in particular relates to apparatus means used in conjunction with the analysis of complex waveforms incident to engine operation and also to improved diagnostic methods used in such apparatus.

BACKGROUND OF THE INVENTION

Servicing thermal combustion engines used in automobiles, trucks, and other vehicles is an old art which has continuously advanced in complexity, requiring ever more sophisticated testing apparatus and analytical skills. As the design and operation of internal combustion engines has become more technologically sophisticated, the adjustment of variables has become increasingly more critical to achieve optimum engine performance. Furthermore, the requirements of environmental antipollution and energy conservation standards have demanded that the optimum performance of internal combustion engines be consistently and regularly achieved.

Accurate, reliable, and repeatable testing of internal combustion engines is thus necessary to determine whether optimum performance is achieved, and if not, to diagnose potential deficiencies in performance and to designate corrective measures.

Traditionally, a service mechanic has provided such evaluative, diagnostic and corrective analysis. The increasing sophistication of internal combustion engines and the multitude of diverse technological fields involved has made it more difficult, and increasingly more expensive, to train a technician having the requisite degree of skill to test, diagnose, and repair an internal combustion engine. And even a sufficiently skilled technician is confronted with differences in the types of engine configuration, ignition systems, and problems encountered.

Many measurement and so-called "diagnostic" apparatus have been known in the prior art which have been used for testing internal combustion engines and providing information on which a diagnosis of engine operating conditions can be based. Principally, these apparatus provide test information relating to the performance of engine systems and require the evaluation of data so that (1) performance deficiencies can be identified; (2) suitable adjustments made; and or (3) defective engine parts can be identified and replaced.

Examples of such testing apparatus include commercial equipment such as the 16-000 and 25-000 Series Engine Analyzers manufactured by Allen Group, Test Products Division, Kalamazoo, Mich. 49007. These engine analyzers provide means for taking thorough measurements under specified test conditions to allow the diagnosis of the various operating systems of an internal combustion engine. Means are included for running a battery of tests of pertinent engine operating parameters. Data collected for each test is recorded in a comprehensive "Diagnostic Report" so that a reliable guide of engine performance under different operating conditions is obtained. Beginning with hookup to the engine, the engine systems tested are: (1) starting, (2) charging, (3) primary, (4) timing, (5) secondary output, (6) performance, (7) carburetor and exhaust, and (8) carburetor adjustment. The collected data for each system test consists of manually recorded data derived from analog meter readings (e.g. volts, current, RPM, dwell, etc.) and oscilloscope observations of electrical system waveforms.

Computer operated testing apparatus has also been proposed, such as described by Aloysius T. Cashel, et al., in U.S. Pat. No. 4,125,894, issued Nov. 14, 1978 and entitled "Engine Test And Display Apparatus." This apparatus also allows a series of measurements of operating parameters of an internal combustion engine to be conducted. A readout of measured engine parameters is displayed in a digital format on the face of a CRT or on a "print out" instead of on a meter; comparative readings occurring under different operating circumstances may be simultaneously displayed. Even though such apparatus allows the programmed acquisition of engine performance data by digital means, the diagnosis of engine deficiencies and maladjustments yet remains the responsibility of the operating technician.

Various diagnostic equations and diagnostic or analytical matrices have been employed as methods to aid the evaluation of measured engine parameters to identify defective engine components or to pinpoint problem areas. For example, diagnostic equations and analytical matrices for use in connection with the aforementioned Allen Test Products 16-000 and 25-000 Series Engine Analyzers are set forth in *Allen Test Programmed Training Course*, a manual provided by the manufacturer which sets forth instructions for use of the test equipment and provides various analytical methods for consideration of the data which the test equipment generates. A typical example includes instructions in the *Training Course* manual with respect to "Starting Current" analysis, which indicate that high current and low cranking voltage is usually caused by a defective starter. Another example is a diagnostic matrix showing the various combinations of evaluative "low", "good", "high" evaluations for cranking volts, engine speed, starter current and recovery voltage, which indicate designated "likely problem[s]".

An apparatus is described by Robert W. Arnston, et al., in U.S. Pat. No. 4,128,005 issued Dec. 5, 1978 and entitled "Automated Engine Component Diagnostic Techniques," (this patent also refers to the apparatus of the aforementioned U.S. Pat. No. 4,125,894), in which engine performance data that is acquired is compared, according to a computer program, against engine specifications; a relative evaluation of that measured data is next obtained, (i.e. "high," "within," "low"), in the form of coded signals. These relative evaluations are collected and stored and then analyzed in matrix format by the computer program according to an AND/OR matrix equation to identify defective engine components or operating areas. Such an apparatus essentially adapts the conventional diagnostic "matrix" to a computer which conducts a similar analysis of stored evaluative data after all pertinent tests of the engine are accomplished.

A deficiency in certain computerized prior art methods and apparatus is their lack of capability to provide a "non-operator" analysis of rapidly varying engine conditions as reflected in electrical system waveform patterns such as are encountered in ignition and alternator system operations. While the prior art apparatus may record absolute values, such as the "peak" or "lowest" value incident to a waveform pattern, they have generally not attempted to analyze changing or transient phenomena with respect to such engine waveforms. This lack of capability has lead to two principal deficiencies: (1) waveform analysis remains a subjective judgment of the operator/technician based on visual evaluation of an oscilloscope display; and (2) waveform analysis "judgments" are excluded from diagnostic equations or programs in computerized apparatus. As to the former, operator judgments may not be absolutely repeatable and certain; regarding the latter, engine diagnosis is conducted on an incomplete data set. The inadequacy of data thereby: (1) reduces the diagnostic capability as to certain parameters which are measured and are interrelated with engine waveform phenomena, and (2) renders it difficult to conduct programmed analysis of pertinent operating and engine components systems which principally involve waveform patterns.

OBJECTS OF THE INVENTION

It is an object of the apparatus described in this Specification to provide a microprocessor based engine analyzer which includes the many different test features of prior engine analyzers, but which in addition, provides improved information acquisition, storage capacity and diagnostic ability in a computerized engine analyzer. It is a further object to provide efficient and less time consuming means in conjunction with microprocessor controlled apparatus to collect engine data based on an engine's real operating characteristics, sift this information automatically, and deduce in a logical manner which part in the engines' starting, charging, fuel distribution, compression, timing or ignition systems needs adjusting, overhauling or replacing. It is thus an object to provide a means for accomplishing testing, data collection and diagnosis with or without a skilled mechanic and to provide apparatus and methods for the efficient utilization of computer adapted diagnostic equipment.

Another object of the apparatus is to provide separate operational modes—manual, semi-automatic, fully automatic—in a testing apparatus which includes an advanced software system that requires operator programming only with respect to the relatively minor inputs of number of cylinders, engine dwell and timing advance specifications, type of ignition, emission control devices (if any), and type of timing (magnetic sensing or timing light), and an optical symptom selection. In providing a symptom selection, it is thus an object of the apparatus to select and emphasize engine operating data for analysis and programmed decision making that is most closely related to possibly defective or mis-adjusted components.

A further object is to provide such means and apparatus to test all four cycle gasoline engines, from three to sixteen cylinders; to display engine operating characteristics (analog, digital and waveform) on a CRT (cathode ray tube), as well as to print out engine characteristics and the diagnosis of faulty or mis-adjusted parts in "hard-copy" form.

It is also an object to provide a significantly increased "data base" of valued engine parameters or conditions on which a computerized diagnosis of an engine is based. This is accomplished by providing a means by which computerized analysis of engine electrical system waveform patterns may be conducted, and conducted repeatably without the error incident to subjective operator judgment based upon visual oscilloscope observation. Accordingly, in a programmed engine analysis, the characteristics of electrical systems themselves may be diagnosed and the diagnosis of further engine systems may include an analysis of performance parameters according to an interrelationship with transient phenomena occurring in electrical waveform patterns. And it is an object of the invention to provide efficient means by which such waveform analysis can be conducted incident to the speed and time requirements of a computer operation.

In this regard, the apparatus described provides means for analyzing electrical system waveforms patterns and for addressing and converting stored data such as derived from ignition waveforms, to actual values which are necessary for a matrix program input. In the apparatus, when a waveform is necessary for analysis it is first stored, in compressed form in toto, in a random access memory according to a logarithmic value reduction. Since extreme variations in amplitude may be encountered in ignition systems during engine operation (e.g. 0 to 50 kilovolts), the logarithmic reduction of waveform values (1) allows storage of the entire "pattern" in a reasonable amount of memory and (2) provides a high degree of accuracy and resolution in the analysis of amplitude values with respect to the extreme variations that may be encountered.

The apparatus further provides for the analysis of engine waveforms by address commands from a processor to the waveform memory. The address command requires output from the memory of a waveform amplitude valve for the particular axis (time) location addressed. By providing hardware conversion means between the addressed memory output and the processor input, the compressed value of the stored amplitude is automatically re-computed back to its actual value before it is input into the processor for analysis. Thus, it is not necessary for the processor to compute the actual value according to a separate conversion program. Hence, the apparatus provides a computer means not only with increased capability, but also means which can be programmed in fewer separate steps. This results in a significant time savings during periods when analytical operations of the apparatus must be performed most quickly, such as in rapid acceleration tests, when engine conditions rapidly change.

A further object of the apparatus is to provide for the efficient utilization of a stored engine waveform pattern as a particular pattern is required for diagnostic analysis according to a diagnostic or analytical matrix. Thus, in conjunction with a waveform pattern memory in an engine diagnostic apparatus, it is an object of the invention to provide a tracking means for the analog-to-digital conversion of measured incremental values encountered in a waveform pattern. Such converter means provides further time saving programming advantages, since, when input waveform values are converted for storage in the pattern memory, the tracking converter, pursuant to the conversion program, tracks whether or not the signal is increasing or decreasing in value with respect to successive values of the waveform. Hence, the conversion program need not begin at "zero" each time a value is to be converted, prior to storage in the memory, but rather a digital conversion begins at the value of the previously converted signal.

Another object is to provide a digital peak detector in conjunction with the tracking converter which identifies a waveform peak in the tracking analog to digital conversion. If, after a predetermined number of consistent relative "up" or "down" sensings, a number of conversion values are consistently sensed in the opposite direction for the next successive values, a waveform "peak" is indicated and this information may be appropriately used for analytical purposes.

Also incident to the waveform pattern memory of the apparatus is an RPM conversion circuit which "scales up" the "engine clock" frequency to provide an accurate high frequency digital signal corresponding to measured engine RPM values which is necessary for optimum programmed operation. Thus, it is an object of the apparatus to provide tachometer circuitry to correlate the engine speed with the capacity of the waveform pattern memory, so that for any given engine speed, the "values" stored in the waveform pattern memory will be sampled in time increments which permit the memory capacity, consistently, to be utilized fully per one engine cycle. Accordingly, resolution and accuracy are improved by providing an optimum number of samplings regardless of engine variables which result from different speeds of operation.

Hence, the apparatus and method described provides efficient diagnosis of engines with a high degree of accuracy and repeatability upon a greatly expanded data base, and with a reduced number of analytical program steps. A majority of "traditional" tune-up parts failures and other tune-up problems may be identified, if not by component, by a system problem.

BRIEF DESCRIPTION OF THE DRAWINGS

With respect to apparatus according to the invention and its operation in conjunction with the invention:

FIG. 3A shows the relationship of the waveform pattern memory upon activation by the control microprocessor.

SUMMARY OF THE INVENTION

Figure 1:
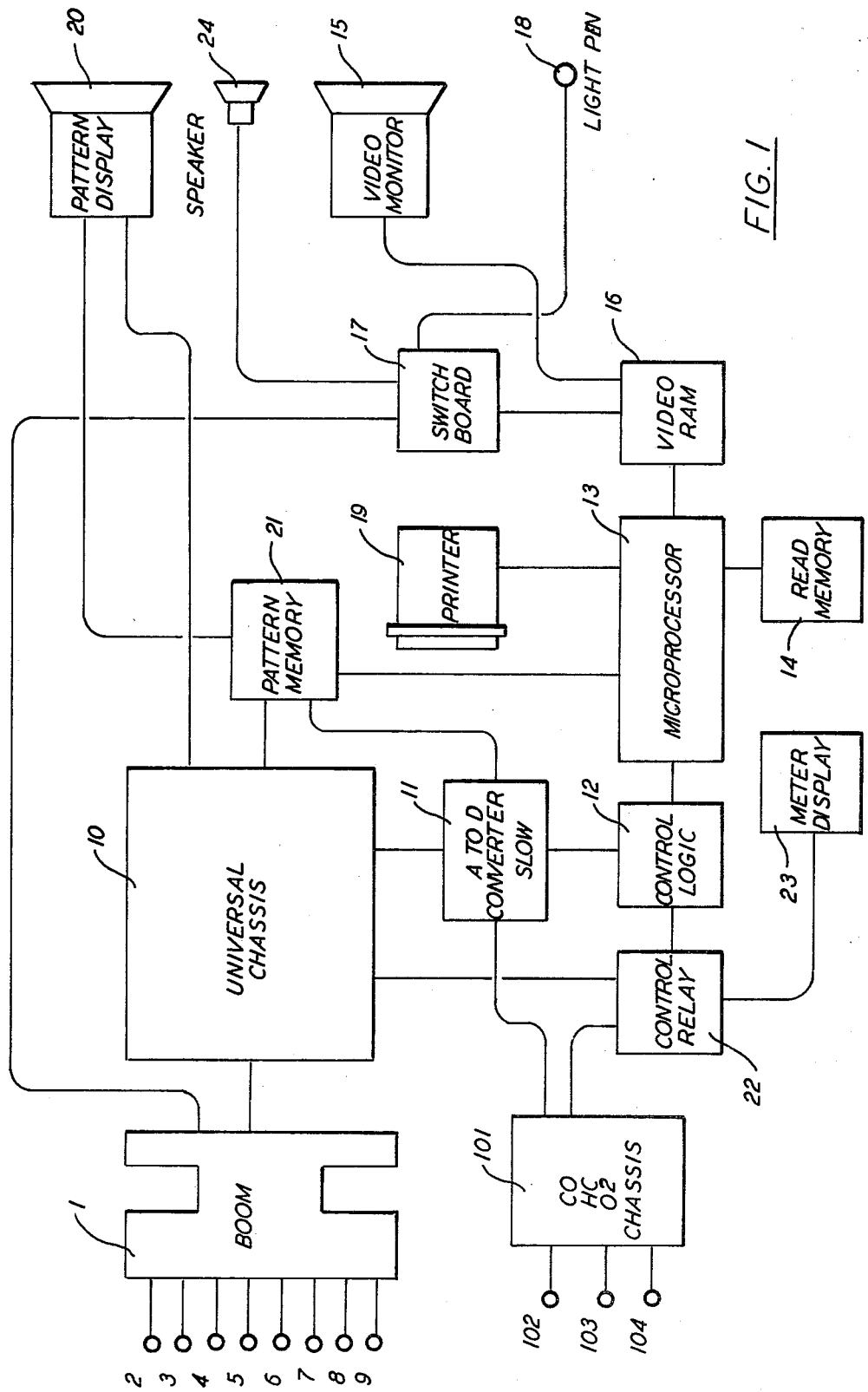
FIG. 1 is a block diagram identifying various physical components of the overall apparatus.

In the preferred embodiment of the present apparatus a diagnosis of an engine "system" is accomplished while measurements of engine operating parameters associated with the system, including electrical system waveforms, during a predetermined mode of engine operation are made and compared in a program defining one or more diagnostic or analytical matrices.

In accord with the means more particularly described in the Examples set out herein and in the Figures, the apparatus provides means for the analysis of various engine waveforms stored in a waveform pattern memory. Thus, diagnosis of complex engine conditions corresponding to such waveforms is accomplished by an analysis of the waveform in toto, rather than by analysis of a mere instantaneous phenomenon such as a "peak" or "low." As a result, greater contextual accuracy of the information on which waveform analysis is based is achieved.

The apparatus provides reliability and certainty in diagnosis while increasing the accuracy of and the amount of data on which diagnosis is based; the calculation efficiency of the apparatus is improved by use of the hardware combinations incident to the registry, storage and analysis of engine waveform patterns in a results based matrix method of analysis. The number of separate program steps necessary in a computerized diagnostic apparatus is thereby reduced.

In the preferred embodiment, a total diagnosis of all engine systems is achieved. As used herein, the term "engine system" refers to those fixed or variable engine components which are conventionally associated together with respect to the performance of an identifiable function associated with engine operation. Such systems generally include: electrical, ignition, carburation, and emission; performance is evaluated with respect to starting, charging, idling, and driving conditions of the engine. For each system, the need for an adjustment to, or the identification of a defective component is indicated in alphabetic characters on the screen of a CRT after appropriate measurements of engine operating parameters for the system are processed and compared with predetermined values, and an evaluation of matrix locations a predetermined diagnostic equation. This procedure is dependent on parameter measurement results which are independent of separately operator specified individual system specifications.

In this regard the only "specifications" required to by input by the operator in the apparatus are overall engine characteristics such as; number of cylinders, type of ignition, and timing advance and engine dwell specifications, emission control devices (if any) and type of timing (magnetic sensing or timing light). These specifications are used in the matrix to qualify decision for each individual engine tested. Based on the preprogrammed relationship of matrix locations, and the input data, information is processed to identify defective systems, parts and adjustments.

The apparatus and method is employed with testing apparatus that allows a competely computerized operation of engine analysis and diagnostic equipment. In such an apparatus, a testing sequence begins with hook-up, and the entry of the operator selectable variables described above into the preprogrammed diagnostic microprocessor to qualify the matrix implemented by the microprocessor and its associated memory.

DESCRIPTION OF THE PREFERRED EMBODIMENT

With reference to FIG. 1, a boom mounted test lead, shown at 1, allows connections to the engine: grounding clip 2; battery connection 3; ignition point or coil negative connection 4; capacitive probe for clipping over the ignition wire to provide an input for secondary pattern waveforms 5; a probe for connection to the first firing cylinder 6; current probe for measuring D.C. current and alternator patterns 7; magnetic timing sensor, and/or timing light 8; and vacuum probe 9.

The boom, engine hook-up and the various lead and test probes may be conventional such as employed in the Allen Group Test Products Division, 16-000 and 25-000 Series Engine Analyzers previously referred to.

As shown in FIG. 1, signals received by the "boom" probes, (2–9) are input into universal chassis 10. Analog signals derived from the universal chassis are converted from the measured analog value into digital signals by means of conventional analog-to-digital conversion circuitry shown at 11 in FIG. 1, which in turn is controlled by control logic PCB, 12, which in turn determines which signals, at which occasions, are to be received for anaylsis by microprocessor 13 which includes a CPU. The analog-to-digital conversion circuitry shown at 11 is conventional and operates at a much lower conversion speed than, and should be distinguished from, the separate analog-to-digital conversion circuitry used in conjunction with the waveform pattern memory as will be hereinafter described. In brief, analog-to-digital converter 11 provides a digital counterpart signal for further processing corresponding to the analog valves registered by the sensor means of the boom test leads 2–9 and emissions probes 102–104.

For complete engine diagnosis and analysis, the apparatus also includes emissions probes 102, 103 and 104 to measure hydrocarbon, carbon monoxide and oxygen content of engine exhaust gases. This probe emanating from chassis 101, is conventional with prior art engine emission analyzers such as the Allen Group Test Products Divisions 23-000 Series, also manufactured by the above-identified Allen Group, Kalamazoo, Mich. 49007. Analog signals generated in such emissions probes are also first converted to digital signals in "slow" A-to-D converter 11. Because the emissions probe output is non-linear with respect to the correspondence between the analog probe signal and emissions concentrations measured, it is thereafter necessary that the probe signal after it is digitally converted be, in turn, converted to an actual value signal for the emissions parameters measured when such signal necessary is for analysis or recordation. The correspondence between the non-linear probe signal and actual value is achieved by "look-up" table means provided by programming in microprocessor 13. The look-up program table converts the first non-linear digital probe signal into a "real value" digital parameter signal which is susceptible to further processing in the apparatus.

In connection with operation of microprocessor 13, there is related read memory 14, which, when addressed during pertinent tests, provides the appropriate logic matrix, look-up tables, and other data by which input engine parameters are processed and analyzed.

Microprocessor 13 also controls the operation of the apparatus through a programmed sequence included in memory 14. The microprocessor is also connected to video monitor 15 through video RAM 16, which provides alphabetic and numeric characters for display and is also an element of switching circuitry 17 operated by lightpen 18.

The preferred embodiment also includes printer means 19, which provides a "hard copy" or multiple copies of information displayed on the screen of the video monitor. Waveform display CRT 20, and waveform pattern memory 21, are provided respectively for visual display of ignition system waveforms and the retention for analysis of the waveform signals. The overall apparatus also includes control/relay means, as depicted at 22, a conventional analog meter display, 23, for visual readout of parameters such as volts, amps, etc. and also speaker 24 for providing audible indications of selection signals registered by the switching circuitry.

Figure 2:
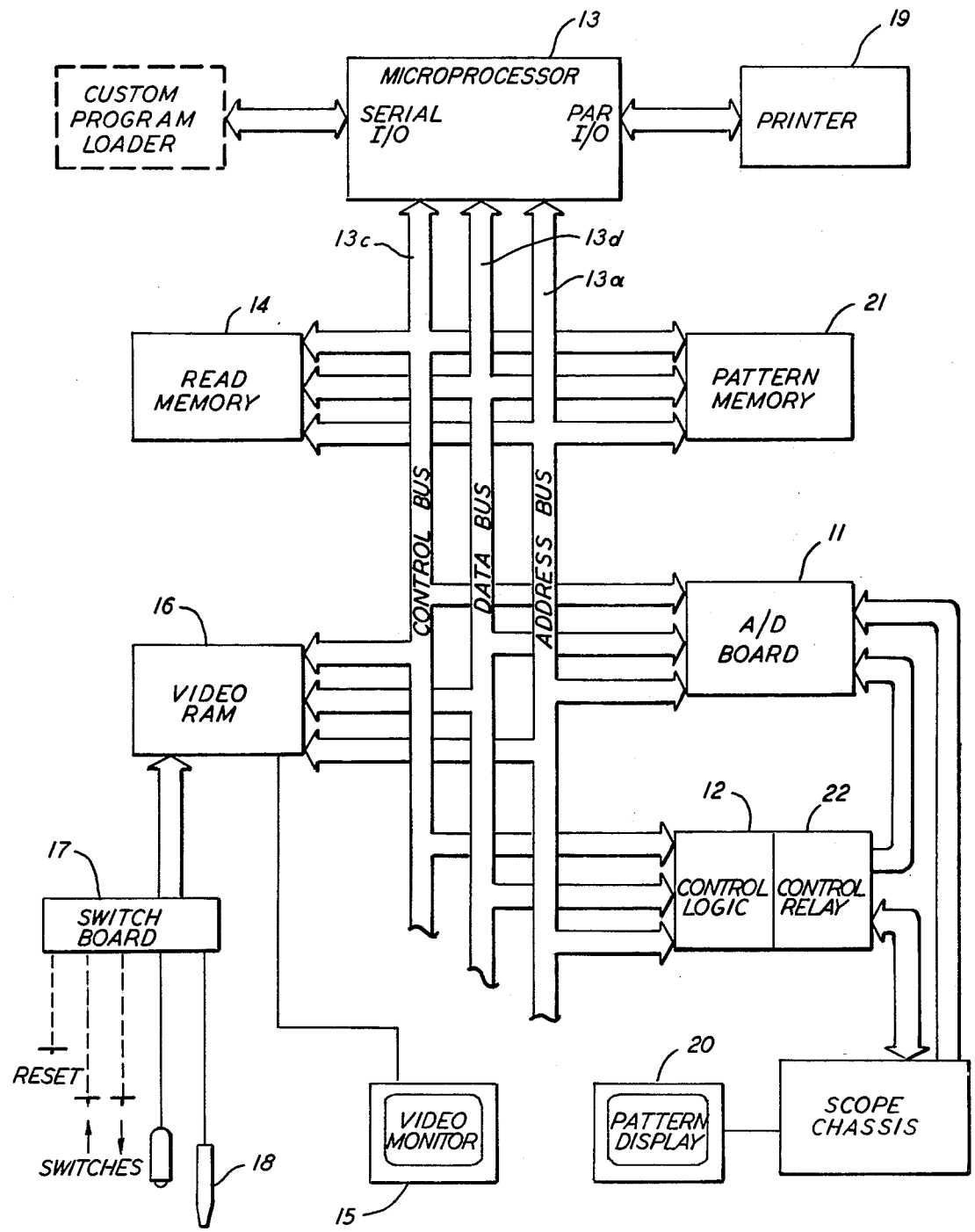
FIG. 2 is a block drawing showing the functional interrelationship of the principal operating components of the apparatus.

Operation of the overall apparatus is conducted in accord with the block diagram shown in FIG. 2 from which the various interrelationships of the respective component devices will be evident to one skilled in the art.

The apparatus includes conventional buses as are used in computers for two way communication between devices which in turn are connected to the bus through tri-state solid state switches in a manner that is known to persons skilled in the art. Normally, one output device is connected to the data bus at a time, but numerous output devices can use the same bus at different times. In accord with programming procedures, which are known to those skilled in the appropriate art, appropriate coded signals provided by the microprocessor in accord with a predetermined time sequence determine which device is using any particular bus and to which device the bus is connected. There are three principal buses: (1) a 16 bit address bus 13a, which provides a binary address (number) that is decoded to select a device for operation under a predetermined circumstances; (2) data bus 13d, which provides a binary word signal or informational data that is being transferred from one device to the other; and (3) the control bus 13c, which provides the signals from the microprocessor which determine whether a particular device should send or receive data upon transmission from the microprocessor of predetermined command signals. With respect to the apparatus herein, interdevice communication along the buses, the determination of the appropriate lines for the buses, and the manipulation of predetermined devices by coded signals involves programming methods and concepts which are known to those having skill in the appropriate art.

The microprocessor 13 is a single board computer. It contains the CPU, a clock for providing repeatable signals at predetermined time intervals pursuant to which programmed operations are undertaken, 4K or RAM (read, write memory), 8K of ROM (read only memory), and 48 lines of parallel input/output ("I/O") capacity. Through signals sent and received along the various buses the microprocessor controls the operation of all other modules in the apparatus, and does all data processing and diagnosis. As shown in FIG. 2, the microprocessor may also be provided with an optional serial input/output port to be used for future expansion of capabilities.

Video monitor 15 contains the conventional video, sync and sweep portions of a television set with improved video frequency response and is used to display characters and to drive the light pen, 18. The light pen detects a light spot (bullseye) displayed on the monitor when there exists a need for the operator to provide an operator selectable input into the apparatus. Upon the correspondence of the pen with an appropriate bullseye displayed on the screen an input is registered when the operator depresses a button on the light pen. A pulse is sent through the switch board to the video RAM. The timed interval between registry of the "button" signal and arrival of the pulse determines where the light pen was located on the screen and in turn determines which operator selectable input should be entered as qualifiers of the ultimate decisions to be made in accord with programmed operations. The video RAM, 16, is also a character display generator which stores characters sent from the microprocessor and encodes them into the video (and sync) signal for display by the monitor 15. Video RAM also latches the location of the beam when a pulse comes from the light pen. Upon command, the video RAM, 16, will send the CPU, 13, (1) the character at any location on the screen, (2) the light pen location and (3) switch-push information.

The control logic board 12 has decoding and processing circuitry, responsive to coded signals provided by the microprocessor, to control the relay board, 22, which shifts levels of activating voltages from the chassis to designated circuits in the apparatus during the sequency programmed operation and also switch patterns for display at CRT 20.

As related earlier, analog-to-digital conversion board 11, includes means for converting analog data signals received from the engine boom and the emissions probe to digital values for the computer. Waveform pattern memory, 21 stores (1) engine waveform patterns in a bi-axial addressable matrix of time vs. amplitude for a selected waveform and (2) the engine condition dwell for the waveform. The pattern memory also generates frozen patterns and provides stored digitized, addressable, pattern valves for analysis by the microprocessor.

Read memory 14, is a 48K read-only-memory used in conjunction with the microprocessor for the storage of programs.

The overall interrelationship of the various components is explained in greater detail with reference to the Examples of the preferred embodiment which are hereinafter discussed.

EXAMPLE I: THE WAVEFORM PATTERN MEMORY

As stated previously, the addressable waveform pattern memory is the operational means of the apparatus which provides expanded data acquisition capability and increased analytical capability by allowing repeatable computer analysis of internal combustion engine electrical system waveforms.

Figure 3:
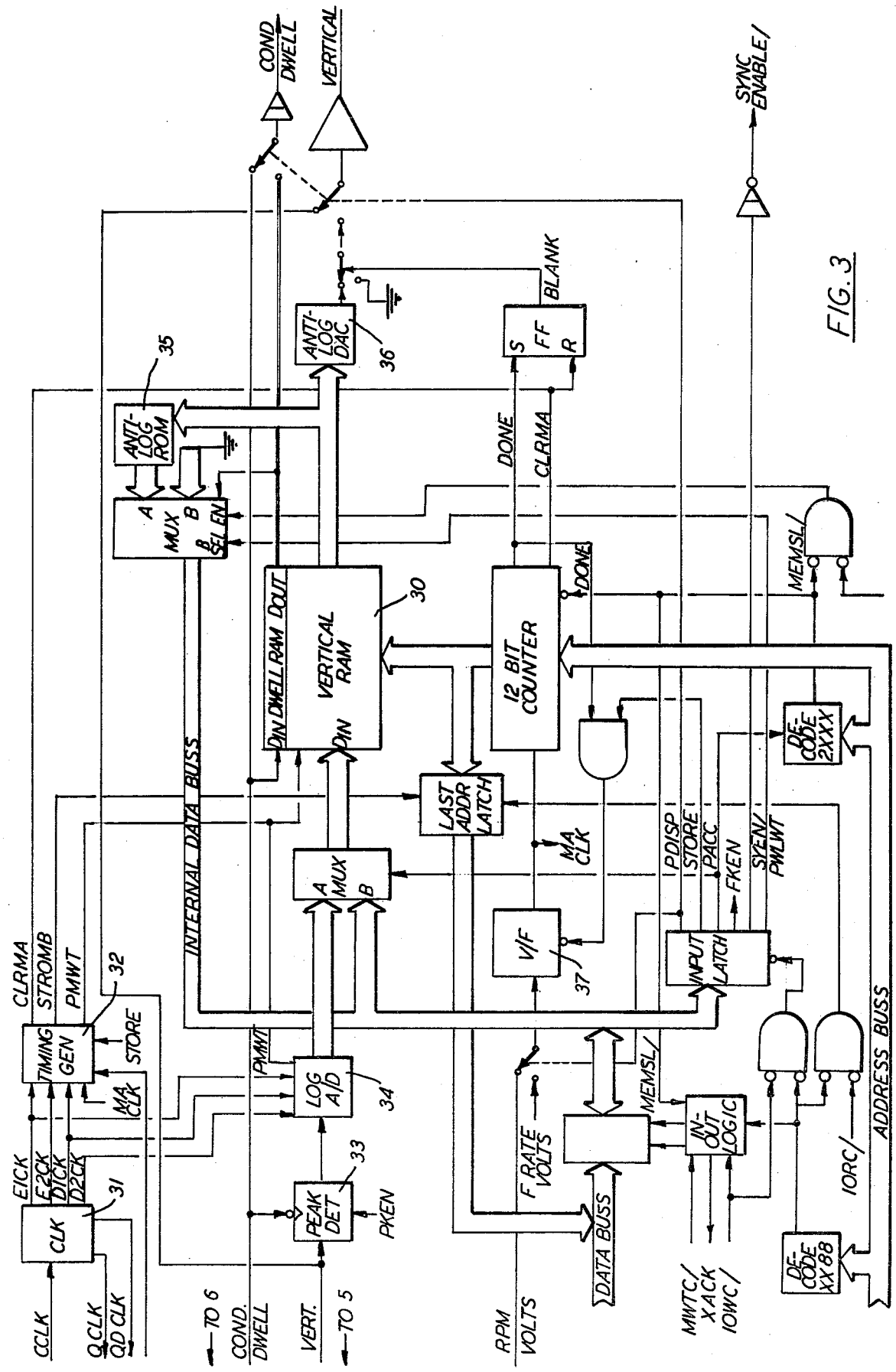
FIG. 3 is a block diagram of the waveform pattern memory means included in conjunction with the apparatus.

The waveform pattern memory means is explained more readily by reference to FIG. 3. As shown in FIG. 3, the waveform pattern memory of the apparatus includes a number of discrete functional circuits and elements which are interrelated to each other and to the addressable memory itself which stores digitized signals corresponding to the amplitude values of a particular engine waveform against an axis of predetermined incremented time segments at which waveform amplitude values are sampled.

The pattern memory continuously receives a paraded signal of ignition system waveforms from the analog section of the apparatus, such as is provided by the connection of the boom ignition secondary lead 5. As with conventional apparatus, the analog waveform signal may also be visually displayed in real time on the pattern CRT, however, a visual display is not necessary for operation of the apparatus. In the apparatus, amplitude values of the parade signal sampled at predetermined time intervals are digitized and stored in a four thousand position random access memory RAM shown at 30 in FIG. 3. Storage of the waveform signal is initiated by registry of the "SWEEP RESET" signal taken from the engine; upon the occurrence of "SWEEP RESET," a "freeze" command from the microprocessor provides that the waveform amplitude values, taken at the determined time intervals are continuously stored at sequential address locations in the RAM. "SWEEP RESET" is a conventional signal such as is generated by the universal chassis in prior art apparatus which occurs immediately before the firing of the Number One cylinder in the firing order. Signals in the nature of "SWEEP RESET" have been used in conventional apparatus to initiate the oscilloscope display of secondary waveform in a regular parade display. One complete engine cycle waveform is stored in the memory; this "frozen" pattern can be displayed on the pattern CRT in stacked, parade or superimposed mode. The engine of the vehicle can be stopped and the pattern CRT will still display the pattern. The pattern memory functions at speeds of 100 to 6000 RPM and will display ignition spikes as short as 5 microseconds and it will display all significant waveform variations.

Figure 8:
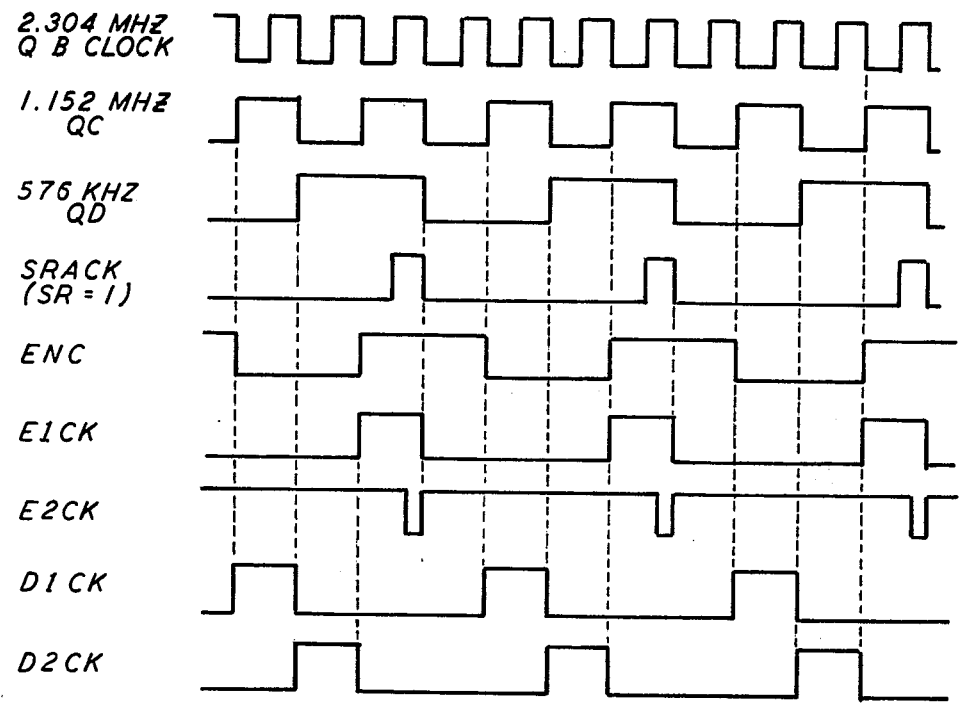
FIG. 8 shows the clock timing characteristics incident to controlled programmed operations.

With reference to FIG. 3, it is shown that employed in conjunction with waveform pattern memory circuitry of the apparatus are clock means 31, timing generator means 32, peak detector means 33, logarithmic analog-to-digital conversion circuitry 34, anti-log read only memory ROM 35, and corresponding anti-logarithmic-to-analog conversion circuitry 36. In conjunction with the programmed operation of such means the clock control characteristic signals of the apparatus are set forth in FIG. 8. The timing coordination of digital components is effected by standard synchronization procedures which should be evident to persons skilled in the art. As will be explained below, the operation of the pattern memory is also coordinated with the RPM value of the operating engine by means of a signal corresponding to RPM which is produced through voltage-to-frequency converter 37.

In general terms which describe the waveform pattern memory operation, upon receipt of a coded command signal from the microprocessor, the clock generator 31, generates several 576 Khz clock pulses to operate the analog-to-digital converter 34, and timing generator 32. The timing generator in turn generates pattern memory write command (PMWT) pulses that cause the converted waveform value data signals to be written into pattern RAM 30 at appropriate timed intervals. These commands occur with each memory address clock (MACLK) signal during the engine cycle to be stored (sweep reset to sweep reset). At the end of the engine revolution, the timing generator puts out a store complete (STRCMP) signal and latches the last address that was used in the pattern RAM. The terminal end of the current stored pattern is thus identified so that the currently stored waveform amplitude values will not be confused with the residual part of any old pattern that may be left over in the unused balance of the memory from a prior test sequence. The programmed sequence of such operation is conducted in accord with programming methods and appropriate coded signals as would be known to one of skill in the programming art.

Figure 4:
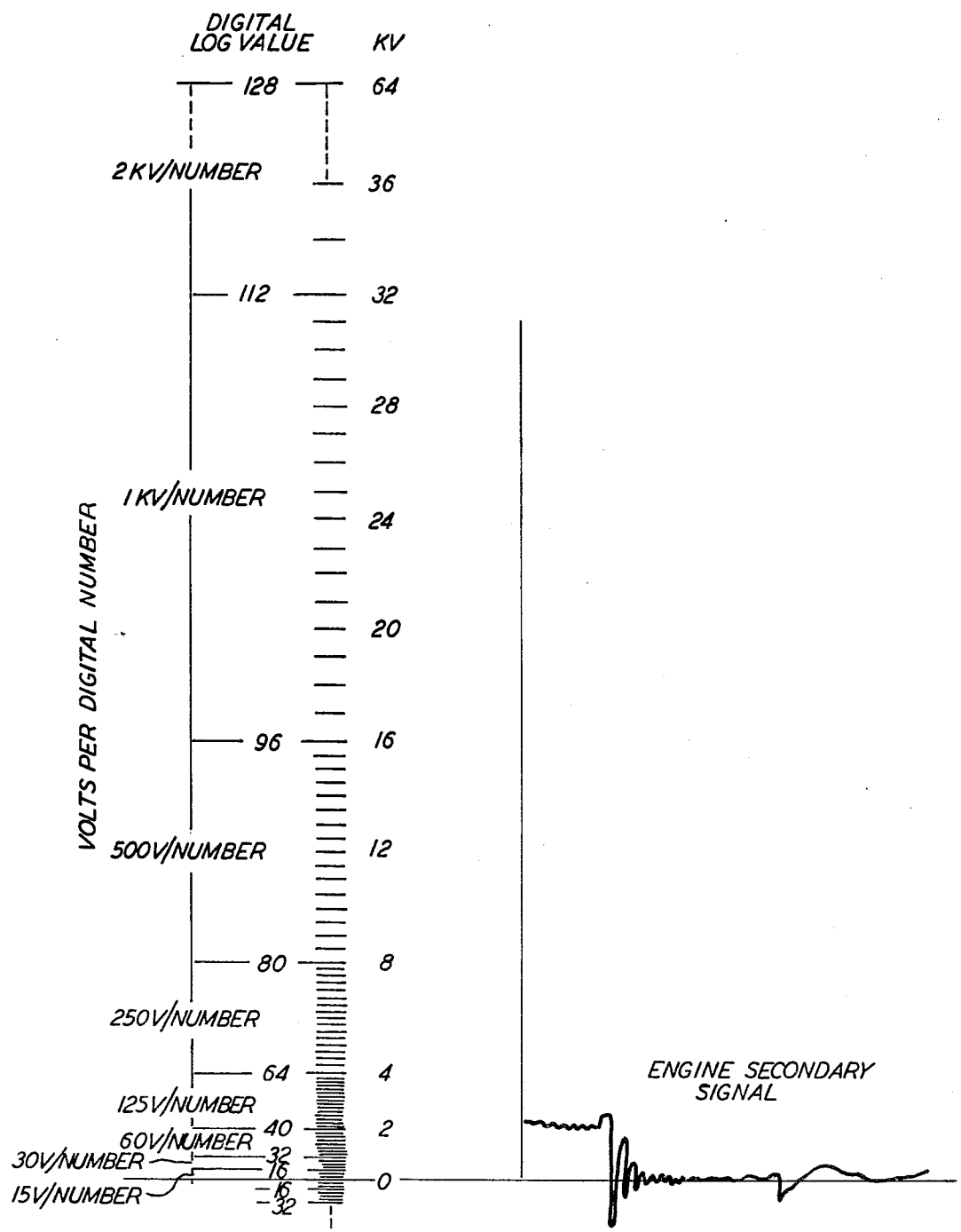
FIG. 4 shows the logarithmic analog-to-digital converter characteristic used in conjunction with the storage of engine waveform amplitudes.

As successive waveform amplitude values are stored, the amplitude signals are first logarithmically reduced in absolute value. This is accomplished by means of logarithmic analog-to-digital converter 34, which provides a digital output related logarithmically in value to the analog input. FIG. 4 shows the correspondence of the logarithmic reduction conversion with respect to the actual analog values encountered in an engine ignition waveform. As is evident from the figure, this conversion provides a very fine scale at small input voltages. Further, since as the pattern RAM has a limited capacity for the storage of digital numbers from 0 to 128, half of the digital log value numbers, which the waveform pattern memory is capable of storing, 0 to 64, are used to represent voltages up to 4 KV; hence, even small variations in the waveform can be defined, when the waveform amplitude is first, logarithmically reduced. At higher input values, the absolute degree of the resolution decreases to approximately 2 KV per digital number; nevertheless, the relative resolution provided by the digital value stored in the pattern RAM is always 3-6% of the actual analog value. When an amplitude log value stored in pattern RAM 30, is required, that value is anti-log converted by means of read only memory ROM 35 and placed in the output line from the pattern RAM, 30, to the microprocessor. This ROM, 35, includes an anti-log conversion program which is correlated inversely with the log amplitude values which are digitally stored in pattern RAM, i.e. the binary number stored at each location in ROM 35 is the anti-log of the address of the location value addressed. Thus, when an address command to RAM 30, provides a logarithmic number output, that output from RAM 30 is used as an address to anti-log ROM 35; the output from RAM 35, is in turn the anti-log digital correspondent value of the number stored in RAM 30. This digital number output by ROM 35 is thus the same value of the input, before the logarithmic reduction of the values stored in RAM 30, and is in turn reconverted to its analog value by means of digital-to-analog converter 36.

EXAMPLE IA: MICROPROCESSOR ACTIVATION OF WAVEFORM STORAGE

By reference to FIG. 3A, the operation of the pattern waveform memory storage means is more particularly illustrated. When switches activate the waveform pattern memory upon coded command signals from the microprocessor, the vertical input signal corresponding to an engine ignition waveform is introduced into the peak detector, 33, which is enabled by the fall of condition dwell (points open) in the engine under test. This assures that short ignition spikes are not lost.

Means used in conjunction with the peak detector are analog-to-digital converter, 34 which provides a digital value for the analog waveform input voltage to RAM, 30. When a coded STORE signal from the microprocessor is present, pattern RAM, 30 will have a WRITE input, and will store waveform data for one engine revolution in accord with address signals from the counter 38 which determine the storage location of successive amplitude values encountered in the waveform.

In this regard, the storage of vertical amplitude values for waveform data in the pattern RAM is coordinated with engine RPM by conversion means 37 so that for any given RPM, successive amplitude value readings for the particular ignition waveform are taken in regular time increments which fully utilize the RAM capacity for any given engine RPM. For example, assuming engine RPM to be 1000 and memory capacity to be 4000, then on the time basis for sampling waveform amplitude values during one engine revolution, four (4) sample values will be taken within every 1/1000 of a predetermined time period so that complete information on one revolution will fully utilize the 4000 available address locations of the memory capacity; if engine RPM were 2000, timing of the sample taking would be different—two (2) samples would be taken every 1/1000 of that predetermined time period—but is similarly dependent on the correlation of RPM and memory capacity to determine particular sample intervals for measuring waveform amplitudes to be stored successively at address locations in the pattern memory 30.

In this connection, an RPM value signal, initially conventionally obtained by measurement of a "points open" interval and further translated by successive conversion means is input into voltage-to-frequency converter, 37 to provide a reliable digital frequency value related to engine RPM which is consistent with requirements for high-speed digital analysis provided by the apparatus. As shown, this signal is input into counter 38.

EXAMPLE IB: RPM SCALING

Figure 6:
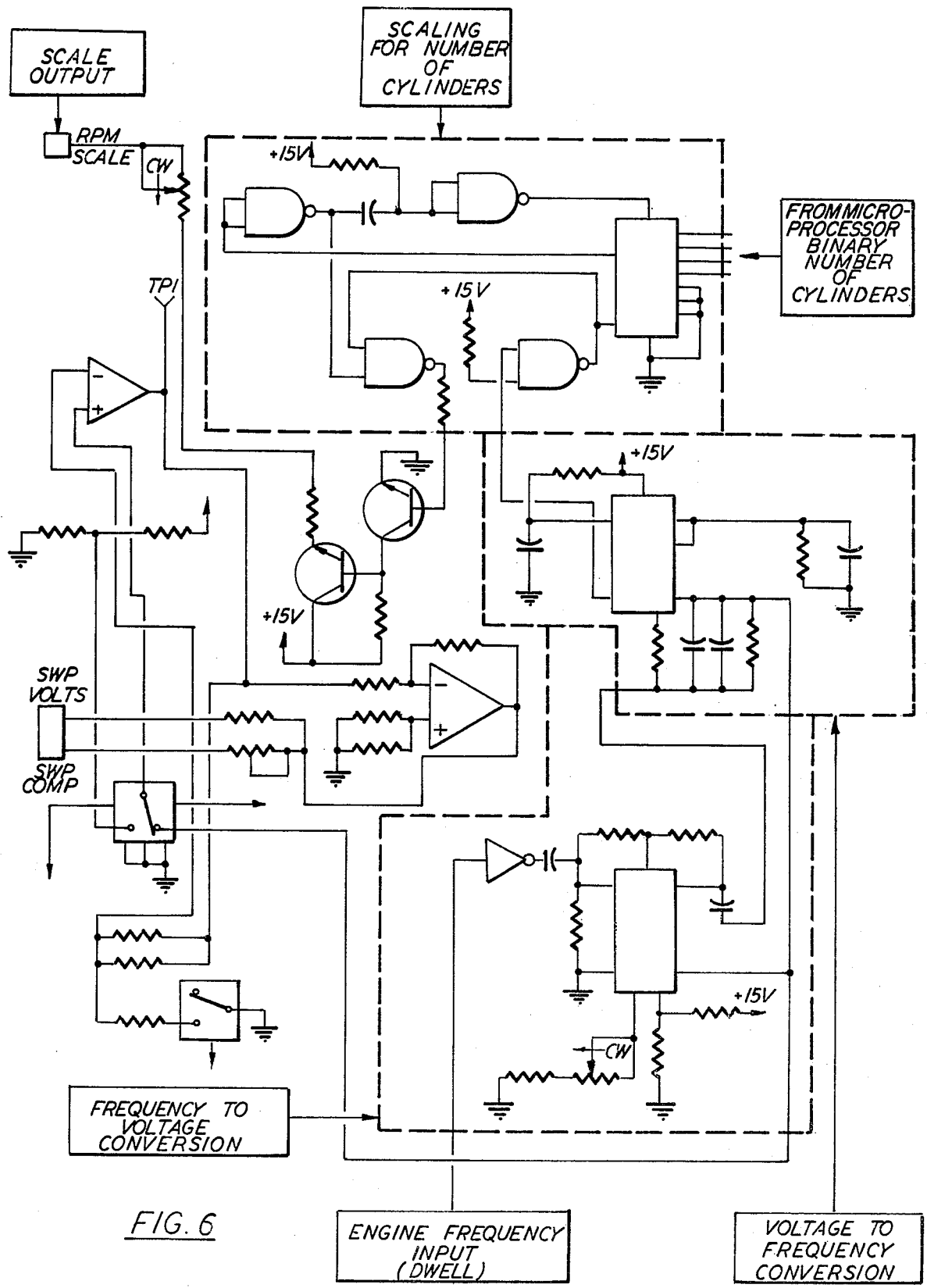
FIG. 6 details the RPM scaling circuit to provide an accurate RPM voltage signal.
Figure 7:
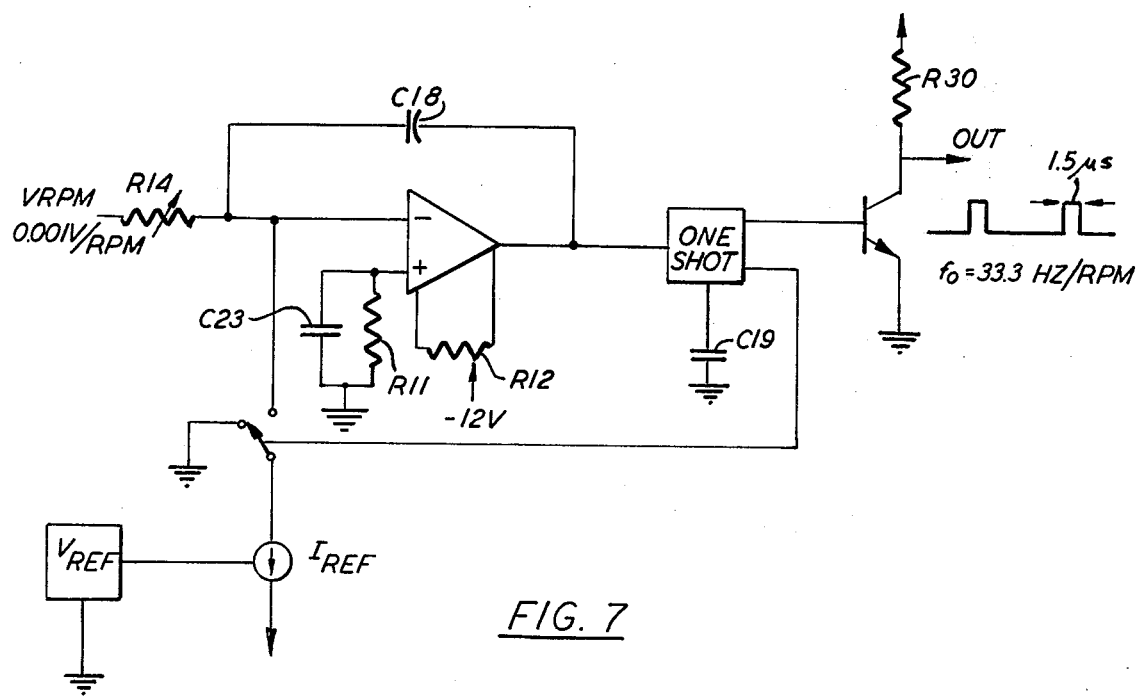
FIG. 7 shows the voltage-to-frequency converter used with the RPM scaling circuit.

This RPM scaling conversion is illustrated by reference to the block diagram of FIG. 5 and is conducted in accord with the circuits shown in FIG. 6 and FIG. 7. The engine points interval signal, which corresponds to a fraction of an engine revolution, (taken from the boom probe) is input into conventional frequency-to-voltage conversion means such as is employed to provide a drive signal for an analog meter. This RPM "voltage" signal in turn is input into voltage-to-frequency conversion means to provide a digital frequency multiplier. A third conversion circuit in turn divides the multiplied frequency by the stored value of "N" which corresponds to the number of cylinders of the engine under test, as input by the operator, ultimately to provide a true digital signal corresponding accurately to engine RPM. The scaling means thus provides a high frequency digitally processable signal corresponding to engine RPM.

Figure 5:
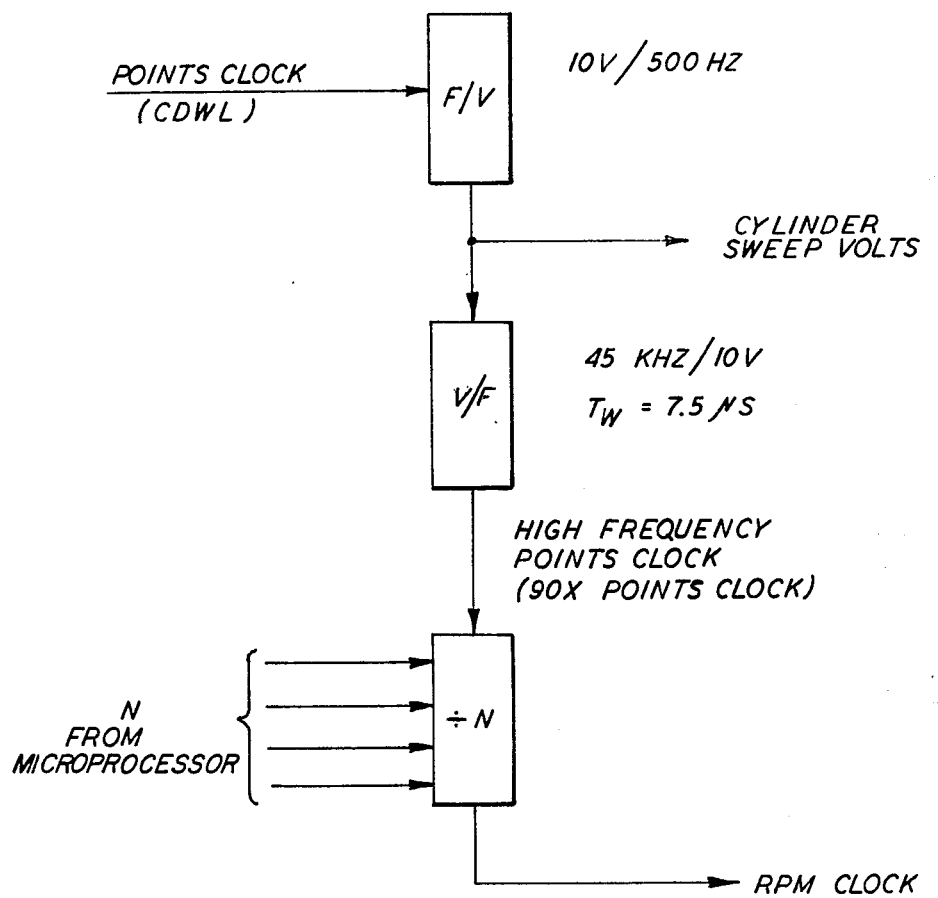
FIG. 5 is a block diagram of the RPM scaling circuit.

With reference to FIG. 5, a first signal having a correspondence with RPM is generated by the engine points. The activating edge of the signal is the negative edge that occurs once per points period when the points open. This edge triggers the frequency-to-voltage converter. Used in conjunction with the converter are four lines with logic levels that represent the binary code for the number of cylinders selected by the operator. These lines are microprocessor controlled by a WRITE operation to the logic PCB. The output signals from the RPM scaling circuit are (1) a cylinder sweep volts signal used to generate a voltage synchronous with the cylinder rate and provide a voltage proportional to the engine points clock; and (2) the RPM clock, a high frequency clock with a digital frequency output proportional to engine RPM which is used as an input to an integrator that generates a voltage accurately proportional to engine RPM. The overally circuitry involved in the successive conversions is shown in FIG. 6. FIG. 7 depicts in isolated form the voltage-to-frequency converter 37, which provides a digital pulse corresponding to RPM used in conjunction with the pattern RAM input to counter 38.

The scaling circuitry set forth solves the difficult problems incident to adapting a low frequency engine operating signal to a "high frequency" digital computing apparatus in which the measured value of the low frequency signal is necessary for apparatus operation. In theory, to generate a signal correlated to cylinder volts, one needs only to integrate the points clock; the same applies to RPM volts with respect to the integration of an engine clock signal (such as the sync signal which occurs once per engine cycle). In the case of RPM volts, to obtain a stable voltage, heavy damping must be used; as a result the response of RPM volts to changes in RPM is greatly sacrificed. [Theoretically, the optimum accuracy of such a signal is to update the RPM volts once per engine cycle (two (2) engine revolutions for a 4 cycle engine).] Thus, to eliminate the aforesaid problem incident to use of an engine clock signal to generate an RPM signal, a points clock signal is used herein instead. The resulting voltage is scaled to the number of cylinders of the engine under test.

In the apparatus herein, scaling is provided by a divide by N counter with the digital input being the latched CPU code for the number of cylinders selected by the operator. With a binary representation, the microprocessor can select from one to sixteen cylinders with four (4) data lines. The advantages of simplicity and virtually zero error are provided by this means. If the digital division were applied directly to the points clock, however, the resulting output clock would be an engine clock which has the theoretically inherent stability-response problem discussed above which results from the low engine frequency involved. Accordingly, the points clock is multiplied to a high rate (by a factor of 90) in the signal conversion. First, the points clock frequency signal is converted to a voltage to obtain a desired signal corresponding to cylinder sweep volts. A frequency-to-voltage converter with a scale factor of 10 V/500 Hz is used for this purpose. This voltage is then input to a voltage-to-frequency converter with a scale factor of 45 KHz/10 V. The resulting output is a high frequency points related clock signal which is then divided, under microprocessor control, to produce an engine related high frequency clock. This clock is integrated to produce a voltage proportional to engine RPM without suffering from the stability-response problem inherent in a low frequency operation.

With reference to the overall waveform pattern memory circuitry shown in FIG. 3 and FIG. 3A, upon input of the scaled RPM voltage, the voltage-to-frequency converter 37, generates a frequency of about 27 Hz per RPM to give 3200 pulses per engine revolution. This digital frequency signal is input to counter 38, which is reset by a SWEEP RESET signal taken from the engine and then counts until the next SWEEP RESET. This second SWEEP RESET, or an overflow (carry out) disables voltage-to-frequency converter stopping the count. During the interval between SWEEP RESET signals, the counter will put 3,200 consecutive addresses to RAM 30, which will correspondingly store sample waveform amplitude values taken from the analog-to-digital converter at each consecutive time interval. Amplitude values of a complete engine cycle are thus stored with respect to a "time" axis at the consecutively addressed locations. The condition dwell status will also be stored at each of these locations.

When a thus "frozen" pattern is desired to be displayed, the input to the voltage-to-frequency converter is switched to a fixed voltage that is equivalent to 2400 RPM for a good, stable display. This clocks the counter 38, so that it sequentially addresses all locations in the memory.

EXAMPLE IC: PATTERN MEMORY DISPLAY

With further reference to FIG. 3, as each memory location is addressed, the output data signal from waveform pattern RAM 30, is fed through anti-log ROM 35 to the digital-to-analog converter 36. The vertical output signal is thus a voltage identical to the original input sample and provides an output waveform in almost exact correspondence with the input that was stored. At the same time, condition dwell from the memory is put out to the chassis to generate SWEEP and SWEEP RESET signals that match the waveform. The counter 38, will repeatedly continue to cycle through the pattern. In the "display" position, the input is disabled to prevent an engine pulse from causing a "SWEEP RESET" signal to come on the wrong cylinder and shift the cylinders in the display.

EXAMPLE ID: PATTERN MEMORY ADDRESS

For the microprocessor to diagnose waveform patterns stored, the microprocessor must access the data in the RAM 30. A tri-state output buffer is provided to the memory output and the counter loads an address from the address bus. In this regard, the address decoder for pattern RAM memory decodes in accord with a predetermined access codes for input and output and addresses. The I/O select line enables an input latch that latches the data from the data bus, setting its output lines. These are then used to set switches to input or to store a pattern, to initiate a freeze (store), and to input or output data from the pattern memory. For example, with reference to FIG. 3A, to display data, the P DISP line would be set to "one". This connects condition dwell input to output, and the vertical input to output as well as connecting the voltage-to-frequency clock to RPM volts. The input line is set high when the microprocessor sends a coded signal through the address bus to activate the input latch through the address decode means. If the store signal is also set high, the previously described storage will store the vertical pattern during the next engine revolution. This can then be displayed by setting the DISP line high with a coded signal on the data lines.

With further reference to FIG. 3A, the microprocessor can secure a waveform sample for analysis by setting the pattern access (PACC) line high and then sending a coded memory read signal to an appropriate address location in pattern RAM. This loads the last three digits (12 bits) of the address into the counter so that it appears on the RAM address lines. The buffer from the RAM output to the data bus is then turned on so that the microprocessor can obtain the data required for a matrix program.

EXAMPLE IE: TRACKING CONVERSION AND PEAK DETECTOR

Converter 34, used in conjunction with the pattern RAM includes a basic analog-to-digital converter, a digital-to-analog converter, a counter, and a comparator and provides means in the apparatus (1) for sequentially calculating a digital amplitude value for an analog waveform pursuant to conversion means which depends upon whether the waveform slope is positive or negative and (2) for identifying "peaks" which appear in the waveform, the detection of which may be used to indicate a defective engine system.

In principle, an analog-to-digital conversion is accomplished by providing a counter means to generate a digital signal having a value corresponding to a measured parameter. Upon the input of an analog signal, such as a waveform amplitude sample taken at an incremental time period, the counter means will provide a digital signal corresponding to amplitude according to a predetermined conversion program.

Thus, for example, a counter will count "up" for a higher amplitude value and "down" for a lower amplitude value. When an automobile engine waveform is analyzed, if the counter were to begin from a "zero" value every time an amplitude value is sampled, a considerable time period, when compared both to the speed of digital operation and the waveform itself would be consumed during each conversion. Were this to occur, waveform amplitude sampling would be limited by the incremental time period required for each digital conversion beginning at "zero."

To more efficiently provide for analysis of rapidly changing waveform patterns, the apparatus herein provides a tracking conversion means which permits the digital conversion to begin at the value of the last preceding conversion value; it is not necessary for the conversion program to begin anew, and in substance repeat itself, when a digital signal corresponding to a waveform amplitude is required for comparison or storage with respect to amplitude values taken at an adjacent time interval.

Figure 10:
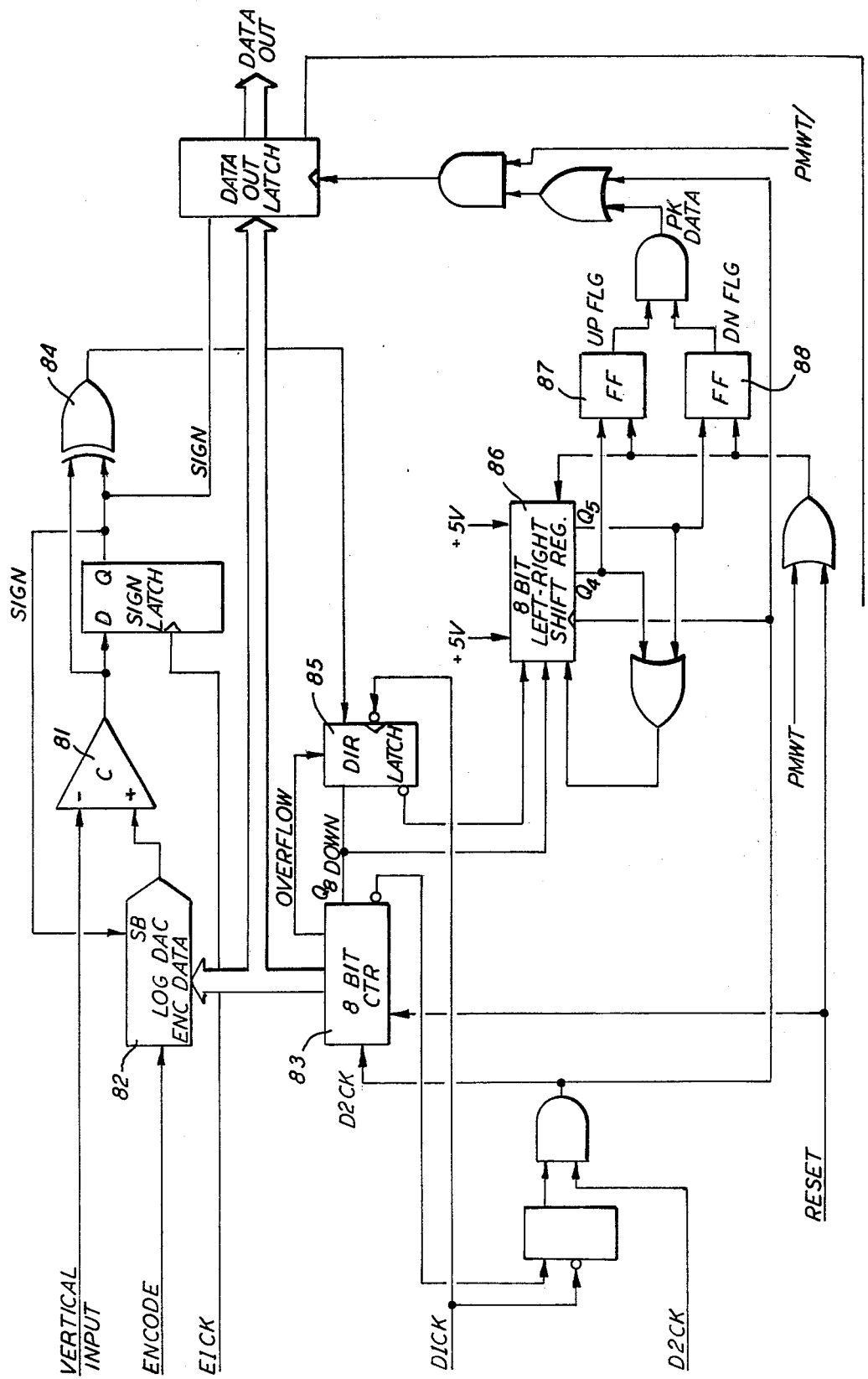
FIG. 10 depicts the digital peak detector and tracking digital converter circuitry used in conjunction with data entry and acquisition in the pattern memory.

FIG. 10 illustrates the conversion means of the apparatus used in conjunction with the storage and analysis of digital signals corresponding to waveform amplitude values in the pattern RAM.

An analog "vertical" input of a waveform amplitude value is provided into one input of comparator means, 81. A digital signal corresponding to a converted analog value of the preceding incremental amplitude value is input into digital-to-analog conversion means 82, which in turn generates the analog voltage signal which is proportional to the preceding digital signal. Conversion means 82 is a companding digital-to-analog converter which conforms to Bell System Mu-255 logarithmic companding law, such as Model DAC-76 manufactured by Precision Monolithics, Inc., Santa Clara, Calif. The companding converter provides the logarithmic reduction of waveform amplitude values in accord with a binary counting function. The output of the digital-to-analog converter is input into the comparator means, 81. The comparator compares the digital-to-analog conversion voltage [the preceding amplitude value] with the vertical input [the present amplitude value] and indicates whether the digital-to-analog voltage is higher or lower than the input. If higher, the counter 83, which during this time has maintained in "memory" the digital signal corresponding to the value of the last preceding input, counts down; and if lower, the counter counts up, so that the conversion "count" counts until the digital-to-analog output equals the vertical input. Thus, the digital conversion tracks the analog value of the last preceding conversion; and in conjunction with the companding converter used in the tracking means provides the logarithmically reduced digital value of the input signal which is then stored in the waveform pattern RAM, 30. The conversion means also provides a capability of detecting the polarity (sign) of a change in waveform amplitude. In this operation, the encode input is dropped to zero and the digital-to-analog output goes to zero so that the comparator can output the sign ("one"=negative) which is then held by the sign latch. This is fed to the digital-to-analog to select the polarity of its output.

When the encode signal goes "high" the comparator output is fed through the XOR gate 84, to the direction latch 85, determine the direction of counting. If the sign is positive and the digital-to-analog voltage is greater than the input, the comparator will output "high" and since the sign bit is "zero" the direction latch will get a "one" and the counter will count down. When the sign is negative and the digital-to-analog voltage is greater than the input (more negative) the comparator will output a "zero" which is now inverted by the XOR gate (since the sign input is a "one"). This will put a "one" to the direction latch instructing the counter to count down (the correct direction).

The direction latch 85, also operates a digital peak detector. This peak detector uses a shift register 86, that shifts right or left. When the counter counts up the shift register shifts a "one" in from the left to the right, and when the counter counts down the shift register shifts a "one" in from the right.

When the counter has counted four counts in the same direction an output will occur at Q4 (counting up) or Q5 (counting down) of the shift register. This output sets the respective up flag latch 87, or down flag latch 88 and clears the shift register.

Figure 9:
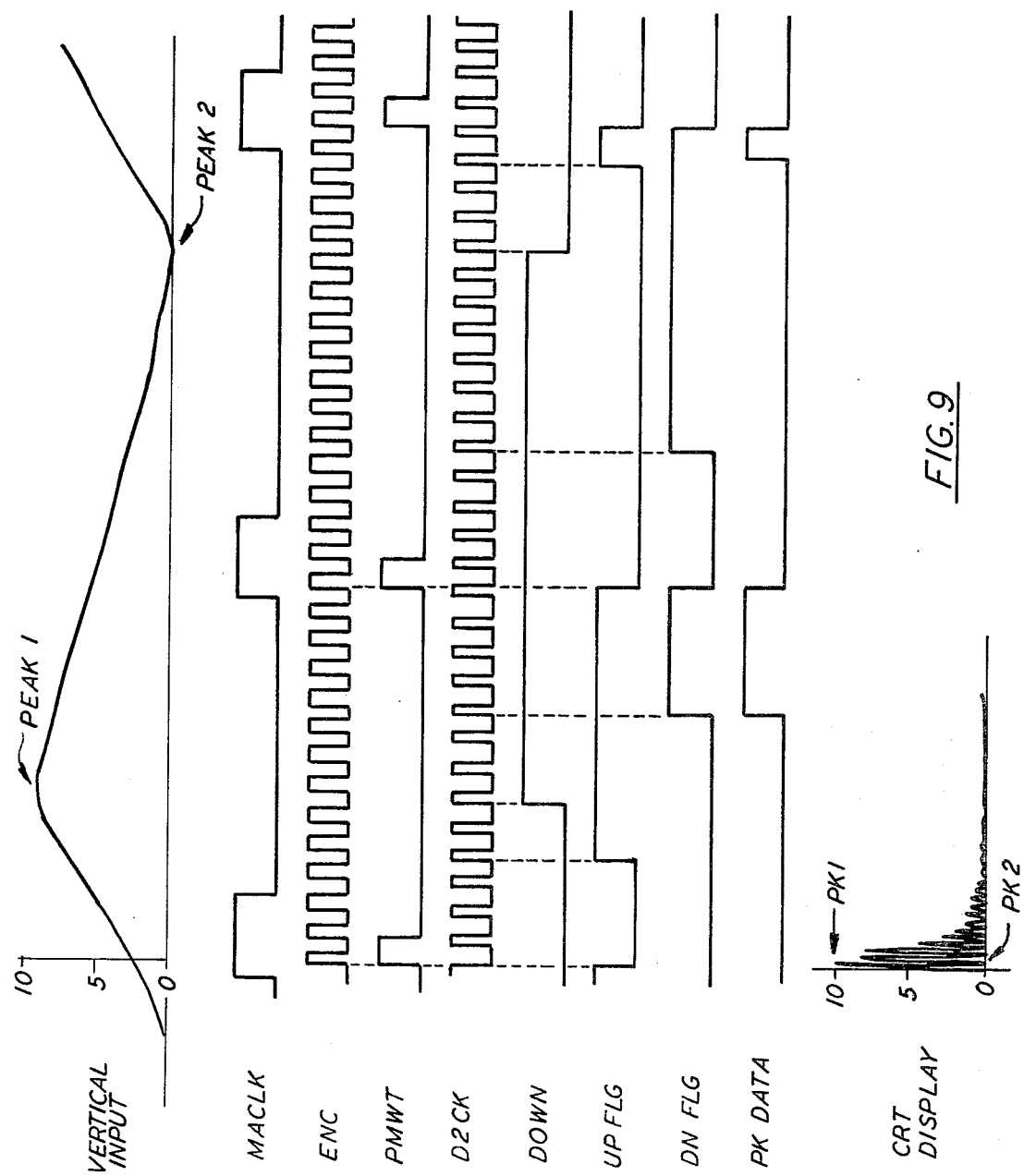
FIG. 9 shows the digital peak detector timing characteristic.

As shown in FIG. 9 the signal coming in may have a peak value that is shorter than a sample interval (1/4000 revolution). In order to identify these peaks the circuit looks for a change in direction. The change in direction is defined as counting up and down both during a PMWT cycle. The counter counts up and the shift register after four shifts sets the up flag and clears itself. The direction changes and the shift register shifts left for four cycles and then sets the down flag. With both flags set, peak data is "high" and the data output latch is clocked to hold the peak value. The four cycle delay means that this value is actually about 7 microseconds after the peak, but it assures that the peak detector does not respond to fast noise signals. The peak data signal also prevents any new data from being put into the latch until after the pattern memory has taken the data.

The output latch can only be clocked when the PMWT signal is high (pattern memory is not writing). It is clocked by the D2CK signal (each count of the counter) or by PEAK DATA signal which stays high preventing D2CK from clocking in any new data.

The counter output from Q8 is used to set the direction latch to down so the counter cannot overflow. The carry out is used to prevent an underflow. When the counter is counting down the carry out will come at "zero". This is then latched to stop the D2CK from going through the AND gate.

By the programmed addressing of the waveform amplitude values stored in the pattern memory, the microprocessor may obtain the waveform pattern information needed for diagnosis by extracting pertinent data relating to operating conditions of the particular ignition system displayed.

Thus for example, waveform patterns stored are analyzed in accord with an analytical program determined in accordance with the signal parameter desired to be examined. With respect to one example, condition dwell in the engine may be determined by programmed analysis of the pattern memory with respect to the edges and peak of a particular waveform. The CPU will address locations in pattern RAM to first determine a waveform edge which should then be followed by successive spikes which indicate waveform peaks in a typical parade pattern of firing order. When the signal crosses zero, the firing time will be ended. Accordingly in this manner, a waveform may be analyzed with respect to variations in dwell, firing voltage, timing variations and other ignition waveform patterns that heretofore have not been within the capability of computer analytical programs.

EXAMPLE II: APPARATUS OPERATION

The waveform pattern memory means described above is used in conjunction with apparatus which performs a pre-programmed sequence of system tests under various engine operating conditions, which the operator is instructed to create by means of instruction displayed on the face of the video monitor CRT. The CRT displays programmed operator instructions, operator selectable input data such as ignition type [e.g. "ELECTRONIC IGNITION"] dwell, timing, number of cylinders, symptom input, [e.g. "HARD STARTING"], test selection information, and test results. The operator enters the appropriate information or selects the test to be preformed by means of the lightpen. Measurements of the engine parameters and a diagnosis of the system are diplayed on the CRT screen at the conclusion of any particular system test.

The character CRT then continues sequentially to display programmed step by step instructions to the operator [e.g. "START ENGINE"] one at a time. The operator selects "CONTINUE" or "CANCEL" with the lightpen and the next succeeding step/instruction is displayed e.g. ["RELEASE THROTTLE" ... "ENRICHEN MIXTURE" ... "SNAP ACCELERATOR"], until the full complement of tests, under the instructed conditions which provide sufficient data for diagnosis, are conducted.

At the conclusion of all individual system tests, separate results for each test are displayed (and optionally printed out) along with the appropriate diagnostic conclusions for each test [e.g. "ARCING POINTS"].

In "automatic" mode of programmed operation, the apparatus performs the following conventional system tests in a predetermined sequence:
(1) Cranking: battery voltage, cranking current, RPM, and primary current are indicated.
(2) High Speed Charging: battery voltage, charging current, RPM, high speed alternator pattern.
(3) High speed ignition: Primary pattern, dwell, timing variations, K.V. requirement.
(4) Low speed charging: Charging current, battery volts, idle alternator pattern.
(5) Low speed carburetion: CO, HC, Oxygen, RPM, Snap acceleration, Vaccum.
(6) Low speed ignition: KV variation, firing time, idle primary current, load KV, firing slope, turbulence.
(7) High speed carburation: CO, HC, Oxygen, RPM, PCV contamination.
(8) Cylinder balance: RPM, Cylinder contribution.

The programmed sequence of tests and the parametric information acquired during each test performed may correspond to that sequence provided in prior art instruction manuals for analog measurement apparatus.

The addressable storage of selected waveform patterns of electrical systems in connection with any particular testing sequence allows a reliable and repeatable analysis of the waveform to be undertaken by appropriate programmed means in the CPU. Thus, for example, accurate information derived from engine system waveforms, such as the adequacy of the alternator pattern, the timing and dwell condition of the engine, and cylinder balance information relating to the adequacy of the ignition pattern for each cylinder, and variations between cylinders may be derived from the waveform information stored. With respect to the alternator pattern, such information may include whether the diode pattern is flat, has missing peaks or is normal or whether there are variations in ripple width. Regarding successive cylinder firings the waveform pattern will provide ignition voltages and timing intervals per cylinder. Such information as is stored in the waveform pattern memory may be addressed in connection with programmed operation to provide analysis of cylinder performance in parade, stacked or superimposed modes.

Because the wavefrom pattern is stored in its entirety, in context, and peaks and spikes are recorded, it is thus possible for programmed means in the apparatus to derive a quantity of information from the waveform as would be possible from a skilled technician's visual inspection of the waveform on an analog oscilloscope display. This information in turn may be useful as a decision making parameter for a further diagnostic analysis of the engine system as a whole according to a specified matrix program. Such analytical examination of waveform patterns stored in an addressable memory and the further diagnosis of such information as may be derived from the waveform pattern involves appropriate programming of the microprocessor which may be provided by persons having skill in the appropriate art.

Very good resolution of waveform signals is provided by the conversion means of the apparatus. When this waveform is required for analysis, the processor addresses the pattern memory to derive information from the stored wave form. The means provided allows a great reduction in the number of microprocessor cycles required for processing, i.e., instead of requiring a program in the processor which would first scan the pattern memory to first determine an amplitude Y at a location X, and then convert the stored valued of Y to its actual value by means of an exponential equation which would first scan the pattern memory to first determine an amplitude Y at a location X, and then convert the stored valued of Y to its actual value by means of an exponential conversion program, the means provides an output having an actual value which is output from the pattern memory to the input data bus of the processor when that actual value is analyzed.

Accordingly, the present apparatus provides improved means for use in conjunction with programmable apparatus for the analysis of engine operating conditions and expands the capability of programmable engine diagnostic apparatus to include the analysis of engine waveform data that were heretofore not susceptible of computer processing.

What is claimed is:

1. Apparatus for electrically storing substantially a time-varying operating parameter of an internal combustion engine comprising:
   electrical signal means adapted to be coupled to the engine for providing a time-varying electrical signal related to the time-varying operating parameter,
   converting means coupled to the electrical signal means for converting the time-varying electrical signal to a series of digital signals representing discrete magnitudes of the time-varying electrical signal at temporally spaced intervals,
   storing means coupled to the converting means for storing digital signals, and
   control means coupled to the storing means for causing digital signals from the converting means representing discrete magnitudes of the time-varying electrical signal at temporally spaced intervals which are determined by the control means in accordance with an operating parameter of the internal combustion engine other than said time-varying operating parameter being electrically stored; to be stored in said storing means, and for causing reading of the stored digital signals out of the storing means.

2. The apparatus according to claim 1 wherein the control means is operative to cause the digital signals stored in the storing means to be read out at temporally spaced intervals which are substantially the same as the temporally spaced intervals determined by the control means.

3. The apparatus according to claim 1 wherein the control means is operative to determine the temporally spaced intervals based on the speed of the engine, the apparatus including means adapted to be coupled to the engine and to the control means to provide an electrical signal to the control means related to the speed of the engine.

4. The apparatus according to the claim 3 and including means coupled to the means adapted to be coupled to the engine and coupled to the control means for receiving said electrical signal and providing to the control means a signal related to a multiple of the engine speed on which the determination of the temporally spaced intervals is based.

5. The apparatus according to claim 1 wherein the control means is coupled to the converting means and causes the converting means to convert at the temporally spaced intervals determined by the control means and to cause the digital signals to be stored in the storing means.

6. The apparatus according to claim 3 wherein the control means is operative to cause the digital signals stored in the storing means to be read out at predetermined constant temporally space intervals which are not dependent on the engine speed used by the control means in storing the digital signals.

7. The apparatus according to claim 1 and comprising means for identifying the beginning and the end of the digitally converted time-varying signal, and wherein the control means is operative in cooperation with the means for identifying to cause the stored digital signals to be read out in a sequence which identifies the beginning and the end of the digitally converted time-varying signal.

8. The apparatus according to claim 7 wherein the means for identifying is operative to generate at least one digital identifying signal which identifies at least one of the beginning and the end of the digitally converted time-varying signal, and wherein the control means is operative to cause the digital identifying signal to be stored by the storing means and to cause the stored digital identifying signal to be read out from the storing means in conjunction with the reading of stored digital signals corresponding to the magnitude of the time-varying electrical signal.

9. The apparatus according to claim 8 wherein the digital identifying signal is based on an operating parameter of the engine.

10. The apparatus according to claim 9 wherein the digital identifying signal represents a predetermined cyclic engine condition.

11. The apparatus according to claim 1 wherein the converting means is operative to convert the time-varying signal to a series of digital signals representing discrete magnitudes of the time-varying electrical signal according to the logarithm of the magnitude of the time-varying electrical signal, the logarithmic digital signals being stored in the storing means.

12. The apparatus according to claim 11 and comprising anti-log converting means coupled to the storing means for converting the logarithmic digital signals read out of the storing means to digital signals substantially representing said discrete magnitudes of the time-varying electrical signal.

13. The apparatus according to claim 1 and comprising anti-log converting means coupled to the storing means for converting the logarithmic digital signals read out of the storing means to a time-varying signal substantially representing said time-varying signal.

14. The apparatus according to claim 10 wherein the storing means comprises a random access memory having addressable memory locations, and wherein the control means is operative to cause digital signals representing discrete magnitudes of the time-varying electrical signal to be stored in the memory locations.

15. The apparatus according to claim 14 wherein the control means is operative to determine the temporally spaced intervals based on engine speed, the apparatus including means adapted to be coupled to the engine for providing an electrical signal related to engine speed to the control means.

16. The apparatus according to claim 15 and including means coupled to the means adapted to be coupled to the engine and coupled to the control means for receiving said electrical signal and providing to the control means a signal related to a multiple of the engine speed on which the determination of the temporally spaced intervals is based.

17. The apparatus according to claim 15 wherein the control means is coupled to the converting means and causes the converting means to convert at the temporally spaced intervals determined by the control means and to cause the digital signals to be stored in the memory locations.

18. The apparatus according to claim 15 wherein the control means is operative to cause the stored digital signals to be read from the memory at predetermined constant temporally spaced intervals which are not dependent on the engine speed used by the control means in storing the digital signals.

19. The apparatus according to claim 15 and comprising means for generating at least one digital identifying signal which identifies at least one of the beginning and the end of the digitally converted time-varying signal, wherein the control means is operative to cause the digital identifying signal to be stored by the memory and to cause the stored digital identifying signal to be read from the memory in conjunction with the reading of stored digital signals corresponding to the magnitude of the time-varying electrical signal.

20. The apparatus according to claim 19 wherein the digital identifying signal represents a predetermined cyclic engine condition.

21. The apparatus according to claim 1 wherein the converting means is a tracking analog-to-digital converter.

22. The apparatus according to claim 21 and comprising a digital peak detector coupled to the tracking analog-to-digital converter.

23. The apparatus according to claim 22 wherein the tracking analog-to-digital converter comprises a digital counter, further means coupled to the counter for converting the output of the digital counter to a first analog signal, means coupled to the further means and the electrical signal means for comparing the first analog signal with the value of the time-varying signal then present at the electrical signal means and for providing a comparison signal corresponding to the qualitative relationship of the compared signals, the count in the counter being incremented, decremented or remaining the same in accordance with the comparison signal, and wherein the digital peak detector comprises means coupled to the counter for indicating when the counter has counted up a predetermined number of counts and down a predetermined number of counts within a predetermined time, thereby indicating that the counter has counted through a peak value.

24. The apparatus according to claim 23 wherein the means for converting the output of the digital counter comprises a logarithmic digital-to-analog converter.

25. The apparatus according to claim 1 wherein the converting means is a tracking logarithmic analog-to-digital converter.

26. The apparatus according to claim 1 and comprising a digital peak detector coupled to the converting means.

27. In a microprocessor-controlled diagnostic apparatus for analyzing at least one system of an internal combustion engine comprising electrical signal means adapted to be coupled to the engine for providing electrical signals related to operating parameters of the engine, converting means coupled to the electrical signal means for converting the electrical signals to digital signals, storing means coupled to the converting means for storing digital signals, and processing means including means for controlling at least the storage of digital signals into and reading of digital signals out of the storing means and for processing the digital signals to analyze the engine system, the improvement comprising:

the electrical signal means further providing a time-varying electrical signal related to a time-varying operating parameter of the engine;

the converting means further converting the time-varying electrical signal to a series of digital magnitude signals representing discrete magnitudes of the time-varying electrical signal at temporally spaced intervals; and the processing means further causing digital magnitude signals from the converting means representing discrete magnitudes of the time-varying electrical signal at temporally spaced intervals which are determined by the processing means in accordance with an operating parameter of the internal combustion engine other than said time-varying operating parameter being electrically stored to be stored in said storing means, and causing reading of the stored digital magnitude signals out of the storing means for at least one of use by the processing means and display by a means for displaying.

28. The apparatus according to claim 27 wherein the storing means comprises a random access memory having addressable memory locations, and wherein the processing means is operative to cause digital signals representing discrete magnitudes of the time-varying electrical signal to be stored in the memory locations.

29. The apparatus according to claim 28 wherein the processing means is operative to determine the temporally spaced intervals based on engine speed, the electrical signal means providing an electrical signal related to engine speed to the control means.

30. The apparatus according to claim 29 and including means coupled to the electrical signal means and coupled to the control means for receiving said electrical signal and providing to the control means a signal related to a multiple of the engine speed on which the determination of the temporally spaced intervals is based.

31. The apparatus according to claim 29 wherein the control means is coupled to the converting means and causes the converting means to convert at the temporally spaced intervals determined by the processing means and to cause the digital signals to be stored in the memory locations.

32. The apparatus according to claim 29 wherein the control means is operative to cause the digital signals stored in the memory to be read out at predetermined constant temporally spaced intervals which are substantially independent of engine speed used by the control means in storing the digital signals.

33. The apparatus according to claim 29 and comprising means for generating at least one digital identifying signal which identifies at least one of the beginning and the end of the digitally converted time-varying signal, wherein the processing means is operative to cause the digital identifying signal to be stored by the memory and to read out the stored digital identifying signal from the memory in conjunction with the reading of stored digital signals corresponding to the magnitude of the time-varying electrical signal.

34. The apparatus according to claim 33 wherein the digital identifying signal represents a predetermined cyclic engine condition.

35. The apparatus according to claim 27 wherein the converting means includes a logarithmic tracking analog-to-digital converter which comprises a digital counter, further means coupled to the counter for converting the output of the counter to a first analog signal logarithmically related to the output of the counter, means coupled to the further means and the electrical signal means for comparing the first analog signal with the value of the time-varying signal then present at the electrical signal means and for providing a comparison signal corresponding to the qualitative relationship of the compared signals, the count in the counter being incremented, decremented or remaining the same in accordance with the comparison signal.

36. The apparatus according to claim 27 wherein the converting means comprises a tracking analog-to-digital converter, and comprising a digital peak detector coupled to the tracking analog-to-digital converter.

37. The apparatus according to claim 46 wherein the tracking analog-to-digital converter comprises a digital counter, further means coupled to the counter for converting the output of the digital counter to a first analog signal, means coupled to the further means and the electrical signal means for comparing the first analog signal with the value of the time-varying signal then present at the electrical signal means and for providing a comparison signal corresponding to the qualitative relationship of the compared signals, the count in the counter being incremented, decremented or remaining the same in accordance with the comparison signal, the digital peak detector comprising means coupled to the counter for indicating when the counter has counted up a predetermined number of counts and down a predetermined number of counts within a predetermined time, thereby indicating that the counter has counted through a peak value.

38. The apparatus according to claim 37 wherein the further means comprises a digital-to-analog converter which provides a signal to the comparing means which is logarithmically related to the counter output.

39. The apparatus according to claim 27 and comprising a digital peak detector coupled to the converting means.

40. The apparatus according to claim 27 wherein the processing means is operative to cause the digital signals stored in the storing means to be read out at temporally spaced intervals which are substantially the same as the temporally spaced intervals determined by the processing means.

41. The apparatus according to claim 29 wherein the processing means is operative to cause the digital signals stored in the memory to be read out at temporally spaced intervals which are based on engine speed and are substantially the same as the temporally spaced intervals determined by the processing means.

42. The apparatus according to claim 3 wherein the control means is operative to cause the digital signals stored in the storing means to be read out at temporally spaced intervals which are based on engine speed and are substantially the same as the temporally spaced intervals determined by the control means.

* * * * *

UNITED STATES PATENT AND TRADEMARK OFFICE
CERTIFICATE OF CORRECTION

PATENT NO. : 4,418,388
DATED : November 29, 1983
INVENTOR(S) : Allgor, et al.

It is certified that error appears in the above—identified patent and that said Letters Patent is hereby corrected as shown below:

Column 6, line 33, after "locations" insert --carried out ccording to--;

Column 6, line 38, change "by" to --be--.

Column 19, line 3, delete ";".

Column 20, line 9, change "1" to --11--;

Column 20, line 14, change "10" to --1--.

Column 22, lines 17 and 18, delete "substantially ndependent of" and insert --not dependent on the--;

Column 22, line 51, change "46" to --36--.

Signed and Sealed this

Third Day of July 1984

[SEAL]

Attest:

GERALD J. MOSSINGHOFF

Attesting Officer   Commissioner of Patents and Trademarks

REEXAMINATION CERTIFICATE (3609th)
United States Patent [19]

Allgor et al.

[11] B1 4,418,388
[45] Certificate Issued Aug. 25, 1998

[54] ENGINE WAVEFORD PATTERN ANALYZER

[75] Inventors: Clarence B. Allgor, Portage; Clair J. St. Clair, Otsego; Richard A. Pearson, Kalamazoo, all of Mich.

[73] Assignee: SPX Corporation, Muskegon, Mich.

Reexamination Requests:
No. 90/004,101, Nov. 13, 1995
No. 90/004,553, Feb. 14, 1997

Reexamination Certificate for:
Patent No.: 4,418,388
Issued: Nov. 29, 1983
Appl. No.: 178,187
Filed: Aug. 14, 1980

Certificate of Correction issued Jul. 3, 1984.

[51] Int. Cl.$^6$ .................................................. G01M 15/00
[52] U.S. Cl. .......................... 701/99; 324/379; 364/179; 701/111
[58] Field of Search .................. 364/424.034, 424.04, 364/431.03, 431.04, 550, 551.01, 179; 73/116, 117.2, 117.3; 324/378, 379; 340/438, 439; 701/99, 101, 102, 110, 111

[56] References Cited

U.S. PATENT DOCUMENTS

| | | | |
|---|---|---|---|
| 3,905,028 | 9/1975 | Wintz et al. | 340/347 AD |
| 3,982,193 | 9/1976 | Maringer | 328/151 |
| 4,050,296 | 9/1977 | Benedict | 73/116 |
| 4,125,894 | 11/1978 | Cashel et al. | 364/442 |
| 4,128,005 | 12/1978 | Arnston et al. | 73/117.3 |
| 4,142,185 | 2/1979 | Gordon | 340/347 AD |
| 4,308,585 | 12/1981 | Jordan | 364/520 |

OTHER PUBLICATIONS

Brochure entitled "AVL Digital Analyzer" (May 1978) (Exhibit A).
Instruction manual for AVL Digital Analyzer Type 646 (04 LD/LA/211/E) (Sep., 1979) (Exhibit C).
Function Description and Trouble Shooting Instructions for AVL Type 646 Digital Analyzer (Oct., 1979) (Exhibit H).
Article entitled "Electronic Measuring System for Digital Recording and Analysing of High Speed Processes" Krassnig (Iseta 75, Fourth International Symposium on Engine Testing Automation Performance, Emission & Diagnostics (Sep. 29–Oct. 3, 1975) (Exhibit I).
Instruction Manual Software F CIS V03 C/E for AVL Digital Analyzer System 646 (May, 1979) (Exhibit J).
"Analog–Digital Conversion Handbook", D. Sheingold, (1972).

*Primary Examiner*—William A. Cuchlinski, Jr.

[57] ABSTRACT

An apparatus which permits the automated diagnosis of automobile engine electrical system waveform patterns is disclosed. Employed in conjunction with an addressable random access memory which stores digitized information concerning the waveform are further means which logarithmically reduce input amplitude values of the waveform and coordinates sampling times for the waveform with engine RPM so that the memory capacity is fully utilized. Input conversion of the waveform is accomplished by a tracking analog-to-digital converter using comparator means which also provides a waveform peak detector. Upon an address command, the memory output is input into a read only memory which provides an anti-log conversion of the logarithmic value stored in the memory, thereby providing an output corresponding to an actual value signal.

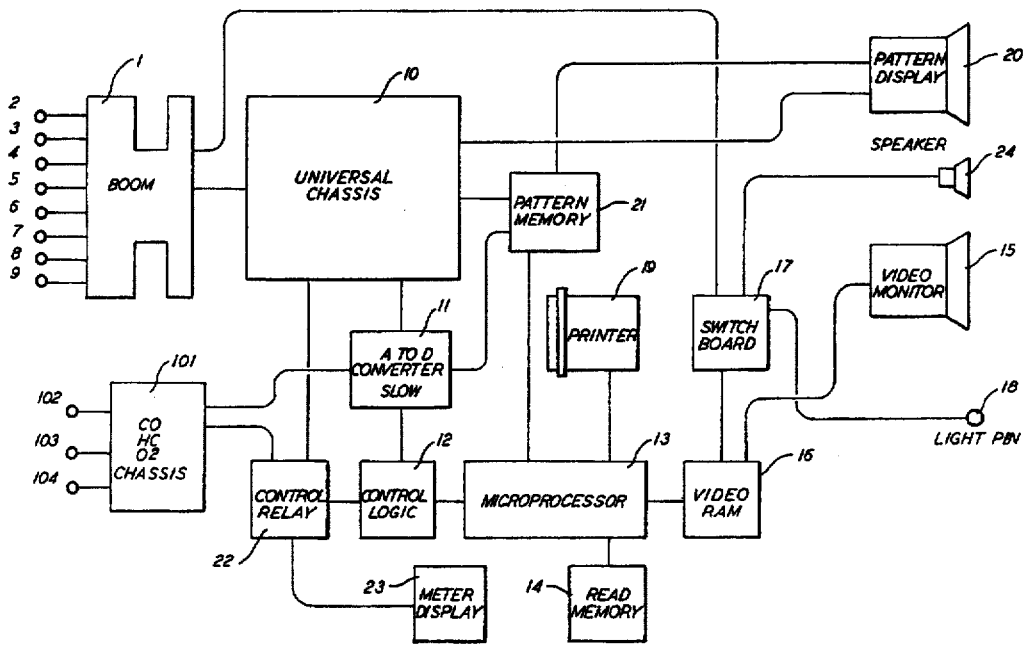

B1 4,418,388

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–12 & 14–42 is confirmed.

Claim 13 is determined to be patentable as amended.

New claims 43–75 were added and determined to be patentable.

1. Apparatus for electrically storing substantially a time-varying operating parameter of an internal combustion engine comprising:
   electrical signal means adapted to be coupled to the engine for providing a time-varying electrical signal related to the time-varying operating parameter,
   converting means coupled to the electrical signal means for converting the time-varying electrical signal to a series of digital signals representing discrete magnitudes of the time-varying electrical signal at temporally spaced intervals,
   storing means coupled to the converting means for storing digital signals, and
   control means coupled to the storing means for causing digital signals from the converting means representing discrete magnitudes of the time-varying electrical signal at temporally spaced intervals which are determined by the control means in accordance with an operating parameter of the internal combustion engine other than said time-varying operating parameter being electrically stored; to be stored in said storing means, and for causing reading of the stored digital signals out of the storing means.

13. The apparatus according to claim 11 and comprising anti-log converting means coupled to the storing means for converting the logarithmic digital signals read out of the storing means to a time-varying signal substantially representing said time-varying [signal] *operating parameter*.

43. *Apparatus for electrically storing a digital representation of a waveform of a time-varying operating parameter of an electrical system of an internal combustion engine, the apparatus comprising:*
   *electrical signal means adapted to be coupled to the electrical system of the engine for providing a time-varying electrical signal related to the time-varying operating parameter of the electrical system;*
   *converting means coupled to the electrical signal means for converting the time-varying electrical signal to a series of digital signals representing discrete magnitudes of the time-varying electrical signal at temporally spaced intervals;*
   *storing means coupled to the converting means for storing digital signals; and*
   *control means coupled to the storing means for causing digital signals from the converting means representing discrete magnitudes of the time-varying electrical signal at temporally spaced intervals, which are determined by the control means as a function of engine speed derived from an electrical signal from the electrical system of the engine, to be stored in said storing means, and for causing reading of the stored digital signals out of the storing means.*

44. *The apparatus according to claim 43, further comprising: display means for displaying a visual representation of the waveform based upon the stored digital signals read out of the storing means.*

45. *The apparatus according to claim 43, wherein the storing means stores the digital signals in sequential locations.*

46. *The apparatus according to claim 43, further including means adapted to be coupled to the electrical system of the engine and to the control means to provide to the control means the electrical signal related to the speed of the engine.*

47. *The apparatus according to claim 43, wherein the control means is coupled to the converting means and causes the converting means to convert at the temporally spaced intervals determined by the control means and to cause the digital signals to be stored in the storing means.*

48. *The apparatus according to claim 43, wherein the control means is operative to cause the digital signals stored in the storing means to be read out at predetermined constant temporally spaced intervals which are not dependent on the engine speed used by the control means in storing the digital signals.*

49. *The apparatus according to claim 43, further comprising means for identifying the beginning and the end of the digitally converted time-varying signal, and wherein the control means is operative in cooperation with the means for identifying to cause the stored digital signals to be read out in a sequence which identifies the beginning and the end of the digitally converted time-varying signal.*

50. *The apparatus to claim 49, wherein the means for identifying is operative to generate at least one digital identifying signal which identifies at least one of the beginning and the end of the digitally converted time-varying signal, and wherein the control means is operative to cause the digital identifying signal to be stored by the storing means and to cause the stored digital identifying signal to be read out from the storing means in conjunction with the reading of stored digital signals corresponding to the magnitude of the time-varying electrical signal.*

51. *The apparatus according to claim 50, wherein the digital identifying signal is based on an operating parameter of the engine.*

52. *The apparatus according to claim 51, wherein the digital identifying signal represents a predetermined cyclic engine condition.*

53. *The apparatus according to claim 43, further comprising a digital peak detector coupled to the converting means.*

54. *Apparatus for electrically storing a digitized ignition waveform pattern representing time-varying ignition voltage of an electrical ignition system of an internal combustion engine, the apparatus comprising:*
   *electrical signal means adapted to be coupled to the electrical ignition system of the engine for providing a time-varying electrical signal related to the time-varying ignition voltage;*
   *converting means coupled to the electrical signal means for converting the time-varying electrical signal to a series of digital signals representing discrete magnitudes of the time-varying electrical signal at temporally spaced intervals;* storing means coupled to the converting means for storing digital signals; and control means coupled to the storing means for causing digital signal from the converting means representing discrete magnitudes of the time-varying electrical signal at temporally spaced intervals, which are determined by the control means in accordance with an operating parameter of the internal combustion engine other than ignition voltage, to be stored in said storing means, and for causing reading of the stored digital signals out of the storing means.

55. The apparatus according to claim 54, further comprising:

display means for displaying a visual representation of the ignition wavform pattern based upon the stored digital signals read out of the storing means.

56. The apparatus according to claim 54, wherein the storing means stores the digital signals in sequential locations.

57. The apparatus according to claim 54, wherein the operating parameter of the internal combustion engine is engine speed.

58. The apparatus according to claim 54, wherein the control means determines the temporally spaced intervals as a function of engine speed based upon an electrical signal derived from the electrical ignition system.

59. The apparatus according to claim 54, wherein the control means is coupled to the converting means and causes the converting means to convert at the temporally spaced intervals determined by the control means and to cause the digital signals to be stored in the storing means.

60. The apparatus according to claim 54, wherein the control means is operative to determine the temporally spaced intervals based on the speed of the engine, the apparatus including means adapted to be coupled to the engine and to the control means to provide an electrical signal to the control means related to the speed of the engine.

61. The apparatus according to claim 60, wherein the control means is operative to cause the digital signals stored in the storing means to be read out at predetermined constant temporally spaced intervals which are not dependent on the engine speed used by the control means in storing the digital signals.

62. The apparatus according to claim 54, further comprising means for identifying the beginning and the end of the digitally converted time-varying signal, and wherein the control means is operative in cooperation with the means for identifying to cause the stored digital signals to be read out in a sequence which identifies the beginning and the end of the digitally converted time-varying signal.

63. The apparatus according to claim 62, wherein the means for identifying is operative to generate at least one digital identifying signal which identifies at least one of the beginning and the end of the digitally converted time-varying signal, and wherein the control means is operative to cause the digital identifying signal to be stored by the storing means and to cause the stored digital identifying signal to be read out from the storing means in conjunction with the reading of stored digital signals corresponding to the magnitude of the time-varying electrical signal.

64. The apparatus according to claim 63, wherein the digital identifying signal is based on an operating parameter of the engine.

65. The apparatus according to claim 64, wherein the digital identifying signal represents a predetermined cyclic engine condition.

66. The apparatus according to claim 54, further comprising a digital peak detector coupled to the converting means.

67. Apparatus for electrically storing a digitized ignition waveform pattern representing ignition voltage of an electrical ignition system of an internal combustion engine as a function of time, the apparatus comprising:

electrical signal means adapted to be coupled to the electrical ignition system of the engine for providing a time-varying analog electrical signal related to time-varying ignition voltage;

converting means coupled to the electrical means for converting the time-varying analog electrical signal to a series of digital signals representing discrete magnitudes of the time-varying analog electrical signal at temporally spaced intervals;

storing means coupled to the converting means for storing digital signals;

means for deriving from the ignition system a signal related to engine speed;

control means coupled to the storing means for causing digital signals from the converting means representing discrete magnitudes of the time-varying analog electrical signal at temporally spaced intervals, which are determined by the control means in accordance with the signal related to engine speed, to be stored in said storing means, and for causing reading of the stored digital signals out of the storing means; and display means for displaying a visual representation of the ignition voltage as a function of time based upon the stored digital signals read out of the storing means.

68. The apparatus of claim 67, wherein the storing means includes a random access memory (RAM) in which the digital signals are stored in sequential locations.

69. The apparatus according to claim 67, wherein the control means is coupled to the converting means and causes the converting means to convert at the temporally spaced intervals determined by the control means and to cause the digital signals to be stored in the storing means.

70. The apparatus according to claim 67, wherein the control means is operative to cause the digital signals stored in the storing means to be read out at predetermined constant temporally spaced intervals which are not dependent on the engine speed used by the control means in storing the digital signals.

71. The apparatus according to claim 67, further comprising means for identifying the beginning and the end of the digitally converted time-varying signal, and wherein the control means is operative in cooperation with the means for identifying to cause the stored digital signals to be read out in a sequence which identifies the beginning and the end of the digital converted time-varying signal.

72. The apparatus according to claim 71, wherein the means for identifying is operative to generate at least one digital identifying signal which identifies at least one of the beginning and the end of the digitally converted time-varying signal, and wherein the control means is operative to cause the digital identifying signal to be stored by the storing means and to cause the stored digital identifying signal to be read out from the storing means in conjunction with the reading of stored digital signals corresponding to the magnitude of the time-varying analog electrical signal.

73. The apparatus according to claim 72, wherein the digital identifying signal is based on an operating parameter of the engine.

74. The apparatus according to claim 73, wherein the digital identifying signal represents a predetermined cyclic engine condition.

75. The apparatus according to claim 67, further comprising a digital peak detector coupled to the converting means.

* * * * *